(12) United States Patent
Hill et al.

(10) Patent No.: US 6,496,351 B2
(45) Date of Patent: Dec. 17, 2002

(54) MEMS DEVICE MEMBERS HAVING PORTIONS THAT CONTACT A SUBSTRATE AND ASSOCIATED METHODS OF OPERATING

(75) Inventors: Edward A. Hill; Ramaswamy Mahadevan, both of Chapel Hill, NC (US)

(73) Assignee: JDS Uniphase Inc. (CA)

( * ) Notice: Subject to any disclaimer, the term of this patent is extended or adjusted under 35 U.S.C. 154(b) by 0 days.

(21) Appl. No.: 09/822,128

(22) Filed: Mar. 30, 2001

(65) Prior Publication Data

US 2002/0018334 A1 Feb. 14, 2002

Related U.S. Application Data

(63) Continuation-in-part of application No. 09/461,247, filed on Dec. 15, 1999, now Pat. No. 6,229,684.

(51) Int. Cl.$^7$ .................................................. H01G 5/01
(52) U.S. Cl. ..................... 361/278; 361/277; 361/298.2
(58) Field of Search ................................ 361/277, 278, 361/281–282, 299.5, 298.2, 298.4, 298.5, 290; 29/25.41, 25.42

(56) References Cited

U.S. PATENT DOCUMENTS

| | | | |
|---|---|---|---|
| 3,646,413 A | 2/1972 | Oomen | 317/246 |
| 3,796,976 A | 3/1974 | Heng et al. | 333/84 M |
| 4,141,080 A | 2/1979 | Paul et al. | 365/87 |
| 4,244,722 A | 1/1981 | Tsuya et al. | 65/32 |
| 4,480,254 A | 10/1984 | Spencer et al. | 343/708 |
| 4,516,091 A | 5/1985 | Sasser | 333/161 |
| 4,554,519 A | 11/1985 | Adam | 333/141 |
| 4,619,001 A | 10/1986 | Kane | 455/192 |
| 4,692,727 A | 9/1987 | Wakino et al. | 333/219 |
| 4,782,313 A | 11/1988 | Brant, Jr. | 333/246 |
| 4,849,722 A | 7/1989 | Cruchon et al. | 333/205 |
| 4,853,660 A | 8/1989 | Schloemann | 333/204 |
| 5,075,600 A | 12/1991 | El-Hamamsy et al. | 315/248 |
| 5,162,977 A | 11/1992 | Paurus et al. | 361/401 |
| 5,164,688 A | 11/1992 | Larson | 333/33 |
| 5,168,249 A | 12/1992 | Larson | 200/181 |
| 5,258,591 A | 11/1993 | Buck | 333/81 A |
| 5,312,790 A | 5/1994 | Sengupta et al. | 501/137 |
| 5,367,136 A | 11/1994 | Buck | 200/600 |
| 5,406,233 A | 4/1995 | Shih et al. | 333/161 |
| 5,467,067 A | 11/1995 | Field et al. | 335/4 |
| 5,479,042 A | 12/1995 | James et al. | 257/415 |
| 5,504,466 A | 4/1996 | Chan-Son-Lint et al. | 333/159 |
| 5,543,765 A | 8/1996 | Cachier | 333/246 |
| 5,568,106 A | 10/1996 | Fang et al. | 333/204 |

(List continued on next page.)

OTHER PUBLICATIONS

Lin et al., "Design, Fabrication, and Testing of a C–Shape Actuator," 8$^{th}$ International Conference on Solid–State Sensors and Actuators and Eurosensors IX. Digest of Technical Papers, Proceedings of the International Solid–State Sensors and Actuators Conference—Transducers '95, Stockholm, Sweden, 1995, vol. 2, pp. 416–419.

Suh et al., "Organic thermal and electrostatic ciliary microactuator array for object manipulation," Sensors and Actuators A, Elsevier Sequoia S.A., Lausanne, Ch, vol. 58, No. 1, 1997, pp. 51–60.

(List continued on next page.)

*Primary Examiner*—Anthony Dinkins
(74) *Attorney, Agent, or Firm*—Myers Bigel Sibley & Sajovec

(57) ABSTRACT

MEMS devices include a substrate, an anchor attached to the substrate, and a multilayer member attached to the anchor and spaced apart from the substrate. The multilayer member can have a first portion that is remote from the anchor and that curls away from the substrate and a second portion that is adjacent the anchor that contacts the substrate. Related methods are also disclosed.

31 Claims, 17 Drawing Sheets

U.S. PATENT DOCUMENTS

| | | | |
|---|---|---|---|
| 5,578,976 A | 11/1996 | Yao | 333/262 |
| 5,587,943 A | 12/1996 | Torok et al. | 365/158 |
| 5,589,845 A | 12/1996 | Yandrofski et al. | 343/909 |
| 5,607,631 A | 3/1997 | Wolfson et al. | 264/61 |
| 5,640,042 A | 6/1997 | Koscica et al. | 257/595 |
| 5,640,133 A | 6/1997 | MacDonald et al. | 333/197 |
| 5,677,823 A | 10/1997 | Smith | 361/234 |
| 5,696,662 A | 12/1997 | Bauhahn | 361/298.1 |
| 5,721,194 A | 2/1998 | Yandrofski et al. | 505/210 |
| 5,770,546 A | 6/1998 | Grothe et al. | 505/210 |
| 5,808,527 A | 9/1998 | De Los Santos | 333/205 |
| 5,818,683 A | 10/1998 | Fujii | 361/277 |
| 5,830,591 A | 11/1998 | Sengupta et al. | 428/701 |
| 5,834,975 A | 11/1998 | Bartlett et al. | 330/278 |
| 5,870,007 A | 2/1999 | Carr et al. | 333/262 |
| 5,870,274 A | 2/1999 | Lucas | 361/311 |
| 5,872,489 A | 2/1999 | Chang et al. | 331/179 |
| 5,972,489 A | 2/1999 | Chang et al. | |
| 5,880,921 A | 3/1999 | Tham et al. | |
| 5,912,472 A | 6/1999 | Voiglaender et al. | |
| 5,912,486 A | 6/1999 | Summerfelt | |
| 5,914,553 A | 6/1999 | Adams et al. | |
| 5,925,455 A | 7/1999 | Bruzzone et al. | |
| 5,926,073 A | 7/1999 | Hasegawa et al. | |
| 5,930,165 A | 7/1999 | Johnson et al. | |
| 6,229,683 B1 * | 5/2001 | Goodwin-Johansson | 361/207 |

OTHER PUBLICATIONS

Sun et al., "A bistable microrelay based on two-segment multimorph cantilever actuators," Micro Electro Mechanical Systems, 1998. MEMS 98. Proceedings., The Eleventh Annual International Workshop on Heidelberg, Germany, Jan. 25–29, 1998, New York, NY, pp.154–159.

International Search Report, PCT/IB01/01010, Feb. 27, 2002.

Benecke et al.; *Applications of Silicon–Microactuators Based on Bimorph Structures*; IEEE Micro Electro Mechanical Systems—An Investigation of Microstructures, Sensors, Actuators, Machines and Robots; IEEE Cat. No. 89TH0249–3, Feb. 20–22, 1989, pp. 116–120, XP–001032597.

International Search Report for PCT/IB00/02051, date Nov. 28, 2000.

* cited by examiner

MEMS DEVICE MEMBERS HAVING PORTIONS THAT CONTACT A SUBSTRATE AND ASSOCIATED METHODS OF OPERATING

CLAIM FOR PRIORITY AND CROSS-REFERENCE TO RELATED APPLICATION

This application claims priority to and is a continuation-in-part of application Ser. No. 09/461,247, filed Dec. 15, 1999 now U.S. Pat. No. 6,229,684, the entire disclosure of which is hereby incorporated herein by reference.

FIELD OF THE INVENTION

The present invention relates generally to microelectromechanical system (MEMS) devices and, more particularly, to multilayer members included in MEMS devices.

BACKGROUND OF THE INVENTION

Microelectromechanical structures (MEMS) and other microengineered devices are presently being developed for a wide variety of applications in view of the size, cost and reliability advantages provided by these devices. For example, one advantageous MEMS device is a variable capacitor in which the interelectrode spacing between a pair of electrodes is controllably varied in order to selectively vary the capacitance between the electrodes. In this regard, conventional MEMS variable capacitors include a pair of electrodes, one of which is typically disposed upon and fixed to the substrate and the other of which is typically carried on a movable actuator or driver. In accordance with MEMS technology, the movable actuator is typically formed by micromachining the substrate such that very small and very precisely defined actuators can be constructed.

While a variable capacitor can be utilized for many applications, tunable filters frequently utilize variable capacitors in order to appropriately tune the filter to pass signals having predetermined frequencies, while rejecting signals having other frequencies. For tunable filters that are utilized for high frequency applications, such as applications involving radio frequency (RF) signals, the tunable filter preferably has a low loss and a high Q, i.e., a high quality factor. Unfortunately, variable capacitors that include electrodes formed of conventional metals generally do not have a sufficiently high Q for high frequency applications. While electrodes formed of superconducting materials would advantageously increase the Q of the resulting variable capacitor, the use of superconducting materials is generally not compatible with the micromachining techniques, such as required to fabricate the actuator of a conventional MEMS variable capacitor. For example, the chemicals, i.e., the etchants, utilized during the micromachining of a substrate would likely harm the acid and water sensitive superconducting materials. In addition, the elevated temperatures, in the range of 400° C. or greater, required for conventional micromachining will cause damage to the temperature-sensitive superconducting materials.

As such, MEMS variable capacitors that have improved performance characteristics are desired for many applications. For example, tunable filters having a higher Q so as to be suitable for filtering high frequency signals are desirable, but are currently large in size, expensive to fabricate and have limited performance characteristics.

SUMMARY OF THE INVENTION

Embodiments according to the present invention provide MEMS devices that include a substrate, an anchor attached to the substrate, and a multilayer member attached to the anchor and spaced apart from the substrate. The multilayer member can have a first portion that is remote from the anchor that curls away from the substrate and a second portion that is adjacent to the anchor that contacts the substrate. In some embodiments, the multilayer member is configured so as to contact the substrate at an intermediate point thereof.

Having the second portion contact the substrate can reduce the spacing between the first portion and the substrate. Reducing the spacing can reduce a voltage level used to actuate the multilayer member relative to the substrate when used, for example, as part of a capacitor, relay, valve or other MEMS device that may move towards and/or away from the substrate.

In some embodiments, the MEMS devices can include connecting members that are attached to the anchors and to the multilayer member. In some embodiments, the connecting members can be serpentine shaped. In some embodiments, the connecting members can be attached to a portion of the multilayer member that is closer to the first portion than the second portion. In other embodiments, the connecting members can be attached to a portion of the multilayer member that is closer to the second portion than the first portion.

In some embodiments according to the present invention, a second anchor can be attached to the substrate and the multilayer member to define an anchor axis which passes through the two anchors. The second portion of the multilayer member can contact the substrate forward of the anchor axis.

In some embodiments according to the present invention, the multilayer member can contact the substrate in response to a thermal effect, such as heating or cooling the multilayer member. In some embodiments according to die present invention, the multilayer member can contact the substrate in response to a difference in tensile stresses between some of the layers included in the multilayer member.

In some embodiments according to the present invention, the MEMS devices can also include a protrusion from the second portion and a receptacle on the substrate. The protrusion can be coupled to the receptacle when the multilayer member is in a first position.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
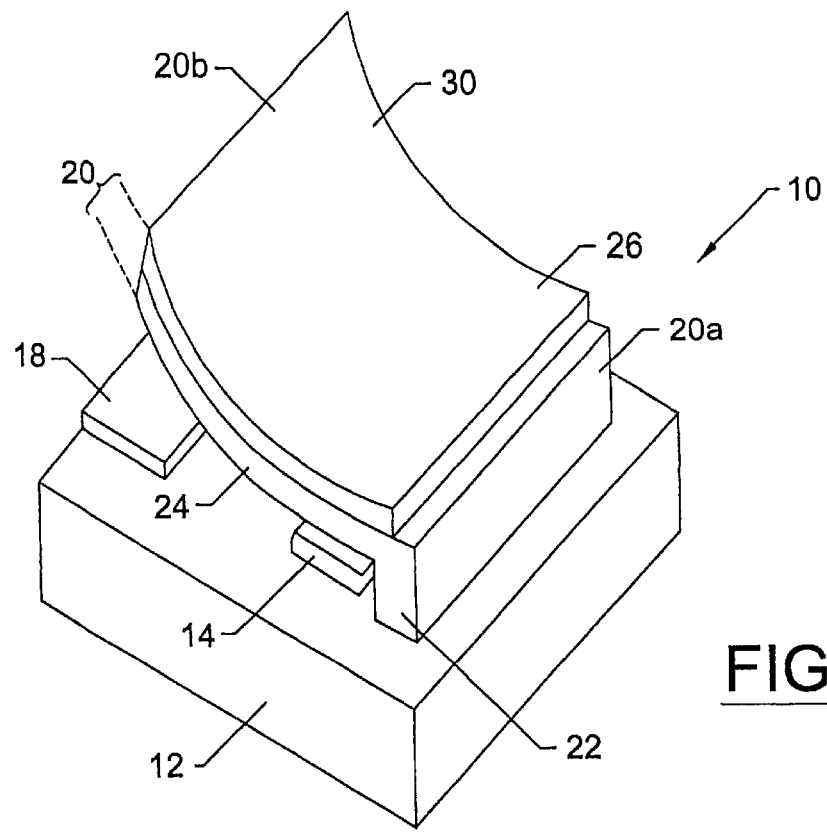
FIG. 1 is a perspective view of a variable capacitor according to one embodiment of the present invention.

Referring now to FIG. 1, a variable capacitor 10 according to one embodiment of the present invention is illustrated. The variable capacitor includes a microelectronic substrate 12. In order to permit components formed of a superconducting material to be formed upon the substrate, the substrate preferably has a high dielectric constant, low loss tangent and a coefficient of thermal expansion (CTE) that is similar to the CTE of the capacitor and electrode materials.

For example, if compatibility with High Temperature Superconductive (HTS) materials is desired, the substrate can be formed of magnesium oxide (MgO) or other similar materials, such as $LaAlO_3$ or $NdCaAlO_4$ may be used. If the electrodes and capacitor plates are formed of non-HTS materials, the substrate can be formed of quartz, sapphire, or other suitable substrate materials.

Figure 2:
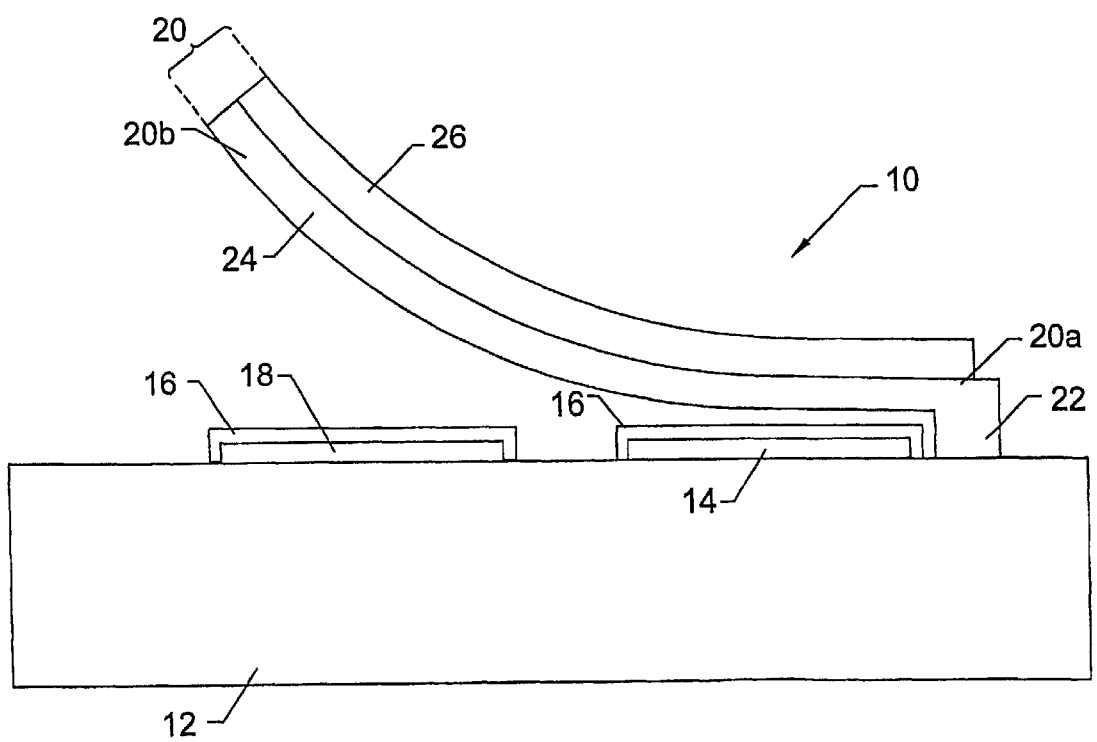
FIG. 2 is a cross-sectional side view of the variable capacitor of FIG. 1.

As shown more clearly in FIG. 2, the variable capacitor 10 also includes at least one substrate electrode 14 disposed upon the substrate 12. Although the variable capacitor can include a plurality of substrate electrodes disposed upon the substrate, the variable capacitor will be hereinafter described in the context of a variable capacitor having a single substrate electrode for purposes of illustration. In order to increase the Q of the resulting variable capacitor, the substrate electrode is formed of a material having low electrical resistance at the frequencies of interest.

In one preferred embodiment of the invention the substrate electrode is formed of a high temperature superconducting (HTS) material. Although various HTS materials can be utilized, the substrate electrode of one advantageous embodiment is formed of Yttrium Barium Copper Oxide (YBCO) or Thallium Barium Calcium Copper Oxide (TBCCO).

Figure 3:
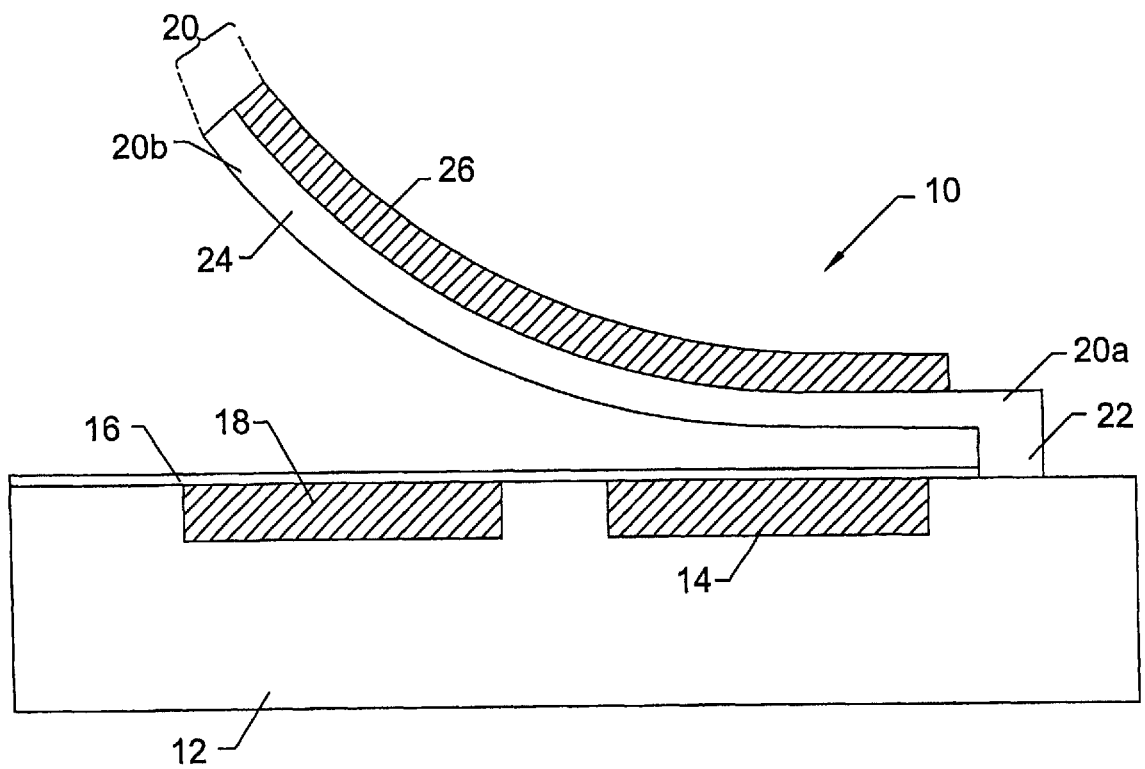
FIG. 3 is a cross-sectional view of a variable capacitor having the substrate electrode and substrate capacitor plate countersunk into the substrate in according with another embodiment of the present invention.

In an alternate embodiment the substrate electrode may comprise a thick metal layer, such as a thick layer of gold. In order to reduce losses, the metal layer must be several times the skin depth of the traversing signal at the frequency of capacitor operation. A thick layer of metal will assure low electrical resistance and allow for conductance of the frequencies of interest. Preferably, the thickness of the metal layer will be at least two times (2X) the skin depth of the traversing signal at the frequency of operation. For example at about 850 MHz, the skin depth is approximately 2 micrometers and the corresponding substrate electrode will have a thickness of about micrometers to about 6 micrometers. Electrodes having such a prominent thickness create severe surface topography in the capacitor device and pose difficulty in fabricating the later formed layers in the capacitor construct. To overcome this problem, the substrate electrode may be countersunk into the substrate by depositing the thick metal layer in a via. FIG. 3 illustrates a cross-sectional view of the variable capacitor that has countersunk into the substrate 12 a substrate electrode 14 (and substrate capacitor plate 18) in accordance with an embodiment of the present invention. The countersinking of the substrate electrode and substrate capacitor plate creates a planar surface for the subsequent protective film 16.

As also shown in FIGS. 2 and 3, a protective dielectric layer 16 optionally covers the substrate electrode 14. As described hereinafter in conjunction with a discussion of a method for fabricating the variable capacitor 10, a dielectric layer is preferably used to cover the substrate electrode in the embodiments in which the substrate electrode is formed of HTS material. The protective nature of the dielectric layer serves to shield the HTS material during the subsequent fabrication steps. In particular, the dielectric layer protects the HTS material from the chemicals utilized during the fabrication process, such as the etchants. As such, the dielectric layer is typically formed of a material that is resistant to the chemicals utilized during the fabrication process, while also, typically, being a low loss dielectric material. In this regard, the dielectric nature of the material serves to electrically isolate the substrate electrode from the bimorph member. In addition, the dielectric layer will typically be a relatively thin film, typically, having a thickness less than about 1 micrometer. In an embodiment that utilizes HTS to form the electrodes the dielectric layer may comprise a polymeric material or another material suitable for providing protection to the HTS material.

In other embodiments that utilize non-HTS substrate electrode(s) the dielectric layer 16 may be omitted. In non-HTS substrate electrode embodiments the protective nature of the dielectric layer is not as critical. If a dielectric layer is used in non-HTS electrode embodiments it is typically employed for the insulating characteristics. As such the dielectric layer in the non-HTS substrate electrode embodiments may comprise an oxide or other suitable dielectric materials. If the dielectric layer is omitted and, thus, air serves as the dielectric, some other type of dielectric clement or isolated standoffs will typically be present in the variable capacitor to prevent shorting of the substrate electrode and the bimorph electrode.

In addition to the substrate electrode 14, the variable capacitor 10 also includes a substrate capacitor plate 18 disposed upon the substrate 12. Like the substrate electrode, the substrate capacitor plate is preferably formed of a material exhibiting low electrical resistance at the frequencies of interest. As such, the substrate capacitor plate is also preferably formed of a HTS material, such as YBCO or TBCCO. Additionally, the substrate capacitor plate may comprise a thick metal layer, such as a thick layer of gold. As described above, the thick metal layer must be several times the skin depth of the traversing signal at the frequency of capacitor operation. Preferably, the thickness of the metal layer will be at least two times (2X) the skin depth of the traversing signal at the frequency of operation. As shown in FIG. 3, in thick metal capacitor plate embodiments the substrate capacitor plate 18 may be countersunk into the substrate 12 to alleviate problems related to topography.

Figure 4A:
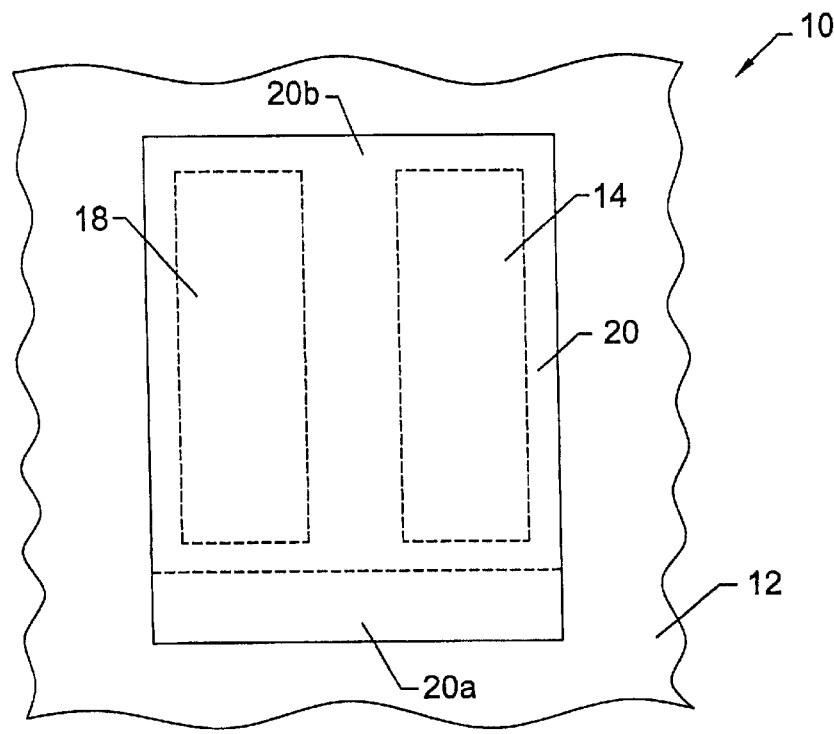
FIGS. 4a–4b are plan views of the variable capacitor depicting two variations of substrate electrode and substrate capacitor plate configuration and shape, in accordance with an embodiment of the present invention.
Figure 4B:
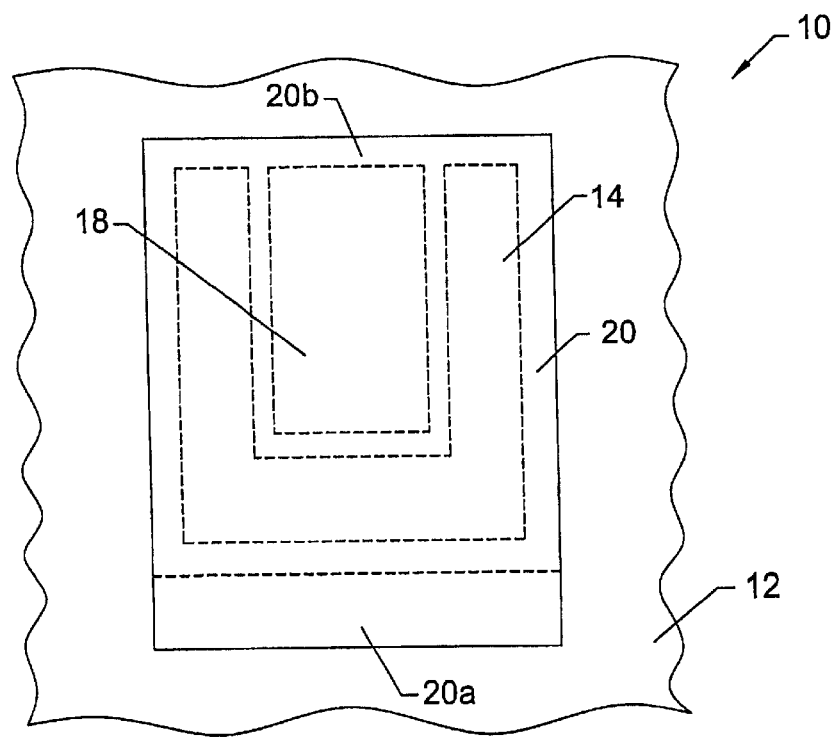

In embodiments in which the substrate electrode and the substrate capacitor plate are formed of the same material, such as YBCO, TBCCO or a thick layer of gold, the processing of these components can be accomplished in the same fabrication step(s). As shown in FIGS. 2 and 3, the substrate capacitor plate is preferably spaced apart from the substrate electrode. In addition, while the substrate capacitor plate and the substrate electrode are illustrated to be approximately the same size and shape, the substrate capacitor plate and the substrate electrode can have different sizes and shapes without departing from the spirit and scope of the present invention. By varying the shape and configuration of the substrate electrode and substrate capacitor plate it is possible to provide for uniform actuation force across the entirety of the bimorph member 20. FIGS. 4a and 4b depict plan views of the variable capacitor 10 detailing alternate shapes and configurations of the substrate electrode and substrate capacitor plate. As shown in FIG. 4a, a preferred embodiment of the substrate electrode and capacitor plate configuration shows the substrate electrode 14 disposed on the substrate 12 lengthwise from an area proximate the fixed portion 20a of the subsequently formed bimorph member 20 to an area proximate the farthest reach of the distal portion 20b of the bimorph member. The substrate capacitor plate 18 is disposed adjacent to the substrate electrode in similar lengthwise fashion. As shown in FIG. 4b, the substrate electrode 14 is U-shaped having the base of the U-shape proximate the fixed portion 20a of the bimorph member 20 and the substrate capacitor plate disposed on the substrate such that it is enclosed on three sides by the U-shaped substrate electrode. Both of these embodiments, as well as other conceivable configuration and shape embodiments are used to insure uniform actuation force is applied across the entire surface of the bimorph member.

As described above, in conjunction with the substrate electrode, a substrate capacitor plate that is formed of a HTS material is also preferably covered with a protective dielectric layer 16 to protect the substrate capacitor plate from the chemicals employed during the fabrication process and to provide for a dielectric. For example, the substrate capacitor plate can be coated with a protective dielectric film of polyimide or another suitable dielectric material. In embodiments in which both the substrate electrode and the substrate capacitor plate are formed of HTS material the dielectric layer may be disposed in the same processing step(s). In embodiments in which the substrate capacitor plate is formed of non-HTS materials the dielectric layer 16 may be omitted. If a dielectric layer is used in non-HTS capacitor plate embodiments it may comprise an oxide material or another suitable dielectric material. If the dielectric layer is omitted and, thus, air serves as the dielectric, some other type of dielectric clement or isolated standoffs will typically be present in the variable capacitor to prevent shorting of the substrate electrode and the bimorph electrode.

As shown in FIGS. 1 and 2, the variable capacitor 10 also includes a bimorph member 20 that is controllably moveable relative to the underlying substrate 12 and, therefore, relative to the substrate capacitor plate 18 disposed upon the substrate. The proximal end 20a of the bimorph member is affixed to the substrate by means of an anchor 22 such that the bimorph member extends outwardly from the substrate in a stairstep fashion and then extends over the substrate electrode to a distal end 20b. As such, the bimorph member overlies the substrate electrode 14 and the substrate capacitor plate in a cantilevered fashion. The anchor shown in FIGS. 1 and 2 is a simplified rigid anchor that runs across the entire proximal end of the bimorph member and allows for the bimorph member to extend in a cantilevered fashion. This type of anchor is shown by way of example only. Other anchor and suspension structures that serve to establish a point of attachment to the substrate and allow for the predetermined mechanical biasing of the cantilevered portion of the bimorph member (i.e. allowing for the bimorph member to contact the upper layer of the substrate construct) are also possible and within the inventive concepts herein disclosed.

The bimorph member 20 includes first and second layers 24, 26 formed of materials having different coefficients of thermal expansion. Thus, the bimorph member will move in response to changes in temperature relative to the substrate 10 and, therefore, relative to the substrate capacitor plate 18. As shown in FIGS. 1 and 2, the materials are preferably selected such that the bimorph member is curled away from the substrate at a predetermined operating temperature, such as about 770° K, in the absence of an applied voltage. In other words, the distal end 20b of the bimorph member is curled away from the substrate relative to the proximal end 20a of the bimorph member that is affixed to the substrate. Typically, the bimorph member is formed such that the material forming the second layer has a greater coefficient of thermal expansion than the first layer so that the bimorph member curls away from the substrate as the bimorph member cools to the predetermined operating temperature after the first and second layers have been deposited in a plane parallel to the substrate at temperatures greater than the predetermined operating temperature as described below.

For example, in a preferred embodiment the bimorph member 20 of one advantageous embodiment includes a first layer 24 of a first flexible metallic material and a second layer 26 of a second flexible metallic material. In one preferred embodiment the first layer may comprise gold and the second layer may comprise aluminum. Typically, the first and second metal materials will have contrasting thermal coefficients of expansion to allow for biasing in the bimorph structure. Alternatively, the first layer may comprise a dielectric material, such as silicon oxide, silicon nitride or a suitable polymeric material and the second layer may comprise a metallic material, such as gold. The materials chosen for fabricating the bimorph member will characteristically be low electrical resistance materials to allow for operation at high frequencies, such as radio frequencies. Additionally, if the bimorph member provides for a dielectric layer, that material will be capable of providing electrical isolation for the chosen materials that comprise the conductive layer of the bimorph member. Additionally, if HTS materials are used to form the substrate electrode 14 and substrate plate 18 then it is advantageous to choose materials that can be deposited at temperatures that are low enough, such as 250° C. or so, so as not to adversely affect the previously deposited HTS elements.

Although not depicted, the bimorph member 20 can also include an adhesion layer between the first and second layers 24, 26 in order to secure the first and second layers together. Although the adhesion layer can be formed of different materials, the adhesion layer is typically formed of chromium or titanium. Typically, those embodiments that use materials that pose bonding difficulty, such as gold, will require the inclusion of an adhesion layer.

As shown in cross section in FIG. 2, the first layer 24 of the bimorph member 20 in this embodiment forms the anchor 22 that is affixed to the substrate 10 as well as an elongated member that extends outwardly in a cantilevered fashion from the proximal end 20a proximate the anchor and over the substrate electrode 14 and the substrate capacitor plate 18 to the distal end 20b. The second layer 26 of the bimorph member of the embodiment depicted in FIGS. 1 and 2 serves as both the bimorph electrode 28 and a bimorph capacitor plate 30. The first layer can be formed of a flexible metal, a polymeric material, an organic dielectric material or another suitable low loss/low resistance material. The second layer is typically formed of a metallic material, such as aluminum or gold. Regardless of the material that forms the first and second layers, the second layer of the bimorph member of this embodiment is continuous, that is, the second layer of the bimorph member extends from the proximal end 20a to the distal end 20b. In this fashion, the second layer extends continuously over both the substrate electrode 14 and the substrate capacitor plate 18. Nevertheless, the variable capacitor 10 of this embodiment also permits the interelectrode spacing of the substrate electrode and the bimorph electrode (i.e. the second layer) to be varied based upon the voltage differential between the second layer of the bimorph member and the substrate electrode, thereby also correspondingly altering the spacing between the substrate capacitor plate and the second layer of the bimorph member that serves as the bimorph capacitor plate.

Figure 5:
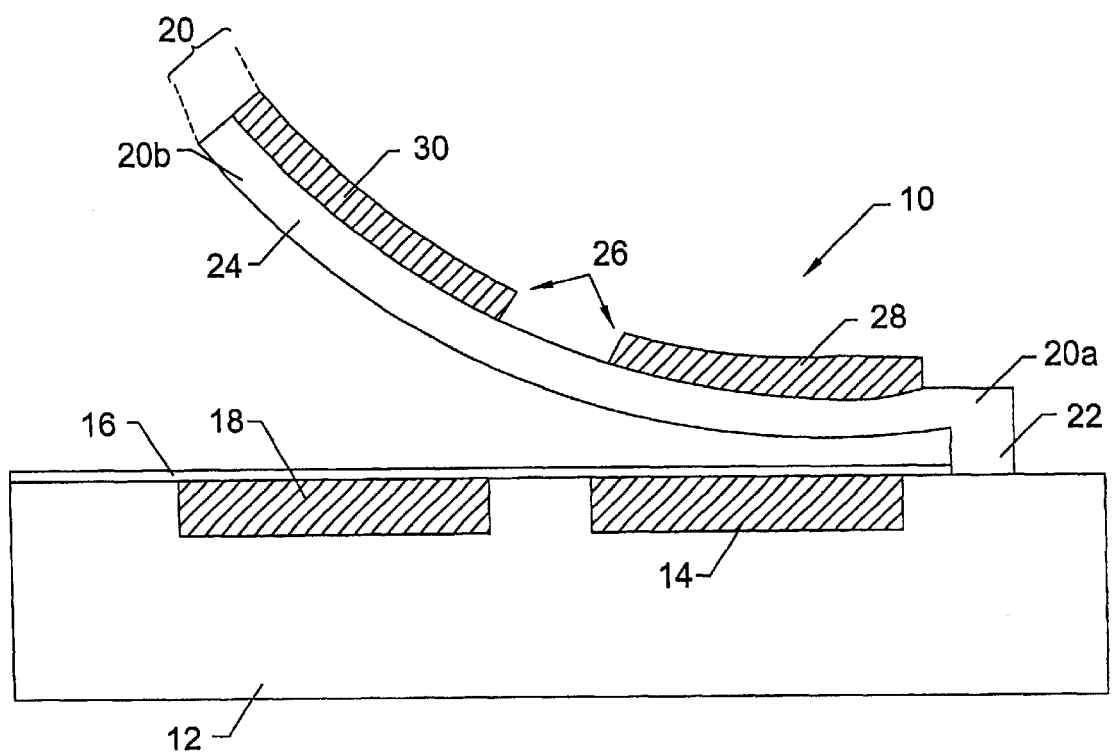
FIG. 5 is a cross-sectional view of a variable capacitor having a bimorph member with a non-continuous second layer having distinct bimorph electrodes(s) and bimorph capacitor plate, in accordance with another embodiment of the present invention.

FIG. 5 shows a cross-sectional view of the variable capacitor 10 having a bimorph electrode 28 and bimorph capacitor plate form the second layer 26 of the bimorph member 20, in accordance with a present embodiment of the present invention. In this embodiment the bimorph electrode and the bimorph capacitor plate are distinct elements that are spaced apart from each other. While the second layer of the bimorph member can include a plurality of distinct bimorph electrodes, the second layer of the bimorph member generally defines the same number of bimorph electrodes as substrate electrodes, such as one bimorph electrode and one substrate electrode in the illustrated FIG. 5 embodiment. The at least one bimorph electrode will be disposed so as to generally align and overlie with corresponding substrate electrode(s). As shown in FIG. 5, the second layer of the bimorph member also defines a distinct bimorph capacitor plate such that the bimorph capacitor plate is spaced from each bimorph electrode and disposed in general alignment with the substrate capacitor plate. In addition, while the bimorph electrode and the bimorph capacitor may have approximately the same size and shape, the bimorph electrode and the bimorph capacitor can have different sizes, shapes and configurations, if so desired. Typically the sizing, shaping and configurations of the bimorph electrodes and bimorph capacitor plate will mirror the sizing, shaping and configuration of the associated substrate electrodes and substrate capacitor plate.

In operation, the spacing between the substrate electrode and second layer/bimorph electrode 14, 26/28 and, in turn, the spacing between the bimorph capacitor plates and the second layer/bimorph capacitor plate 18, 26/30 is controlled by selectively altering the voltages applied to the substrate and bimorph electrodes. In this regard, the voltage differential between the substrate and bimorph electrodes will cause the bimorph member 20 that carries the bimorph electrode to be moved relative to the substrate electrode, thereby altering the interelectrode spacing in a controlled fashion. Since the bimorph capacitor plate is also carried by the bimorph member, any movement of the bimorph member relative to the substrate in response to a voltage differential established between the substrate and bimorph electrodes also controllably varies the spacing between the bimorph capacitor plate and the substrate capacitor plate, thereby also controllably adjusting the resulting capacitance of the variable capacitor 10 of the present invention. Since the capacitance established between a pair of capacitor plates varies according to the inverse of the distance or spacing between the plates, the capacitance of the variable capacitor will increase as the bimorph member is uncurled toward the underlying substrate. Correspondingly, the capacitance of the variable capacitor will decrease as the bimorph member curls further away from the substrate.

By electrically connecting the substrate electrodes and second layer/bimorph electrodes 14, 26/28 to respective electrical leads and the substrate capacitor plate and second layer/bimorph capacitor plates 18, 26/30 to an inductor in a manner known to those skilled in the art, the variable capacitor 10 of the present invention can be used as a tunable filter. By varying the interelectrode spacing and, in turn, the spacing between the substrate and bimorph capacitor plates, the filtering characteristics can be controllably modified. The filter can be configured to pass signals having a predetermined range of frequency, while rejecting signals having frequencies outside the predetermined range (i.e. a band-pass filter) or, alternatively, the filter can be configured to reject a predetermined range of frequency, while passing signals having frequencies outside the predetermined range (i.e. a band-reject filter). Since the substrate electrode and the substrate capacitor are preferably constructed of material (s) that have low electrical resistance for signals having relatively high frequencies, the tunable filter is particularly advantageous for filtering signals having high frequencies, such as signals having radio frequencies. In addition, the low electrical resistance characteristics of the substrate electrode and the substrate N t capacitor plate will result in a tunable filter that has a high Q, as desired for many applications. The Q factor of the variable capacitors of the present invention and the resulting tunable filter can exceed 2000.

Figure 6A:
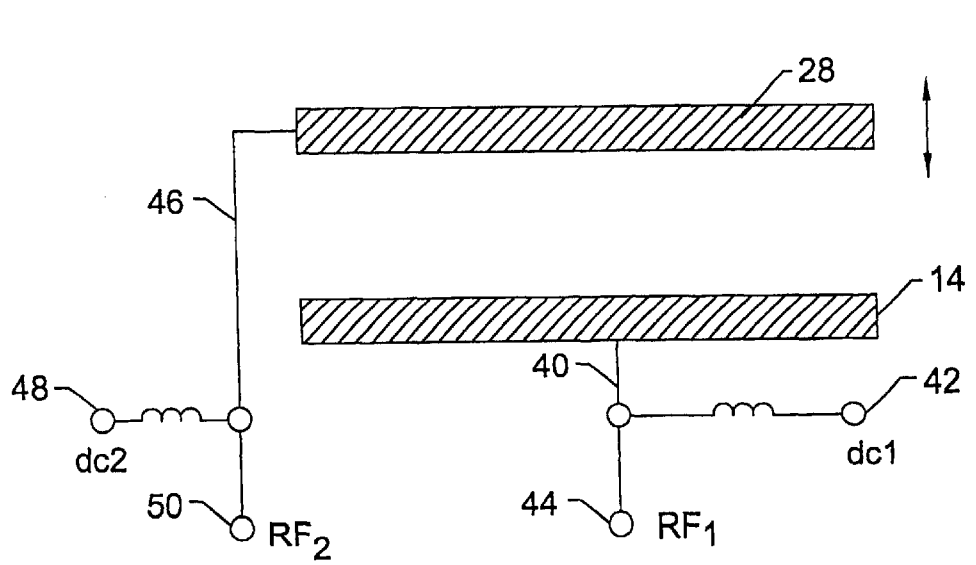
FIGS. 6a–6b are simplified electrical schematics of a two terminal and three terminal variable capacitor, in accordance with embodiments of the present invention.

In the most basic embodiment of the present invention, the variable capacitor is formed as a two-terminal device. FIG. 6a depicts an electrical schematic drawing of a two-terminal variable capacitor 10 having a substrate electrode 14 and bimorph electrode 28 in accordance with an embodiment of the present invention. In this configuration the DC bias and the RF signal share the same leads to the device. The substrate electrode is connected to a first lead 40 that leads to a first DC bias 42 and a first RF signal 44. The bimorph electrode is connected to a second lead 46 that leads to a second DC bias 48 and a second RF signal 50. In this configuration the substrate electrode and the bimorph electrode serve dual roles as the actuation electrode and the capacitor plate electrode. However, in this embodiment when high RF frequencies are encountered during operation the DC bias network has a tendency to interact and degrade the AC signal. In this regard, it is beneficial to implement the variable capacitor of the present invention as a 3 or greater terminal device to increase the relative isolation of the AC signal from the DC bias network.

Figure 6B:
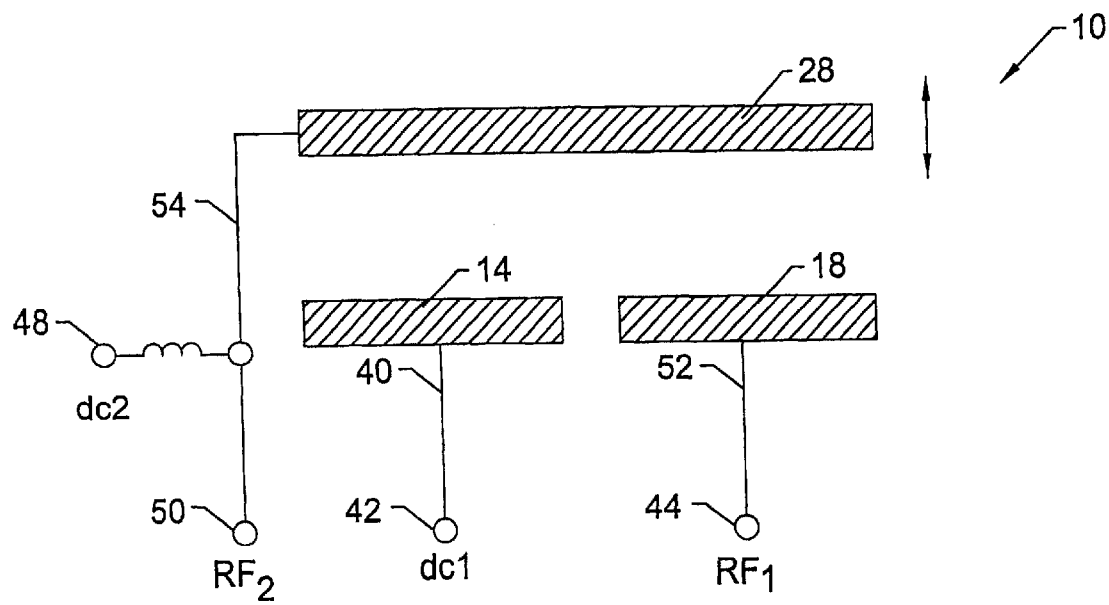

FIG. 6b depicts an electrical schematic of a three-terminal variable capacitor 10 having a substrate electrode 14, a substrate capacitor plate electrode 18 and a bimorph electrode 28 (disposed on the bimorph member) in accordance with an embodiment of the present invention. The substrate electrode is connected to a first lead 40 that leads to a first DC bias 42. The substrate capacitor plate is connected to a second lead 52 that leads to a first RF signal 44. The bimorph electrode is connected to a third lead 54 that leads to a second DC bias 48 and a second RF signal 50; the bimorph electrode is left at a floating potential. It is also possible to implement four or five terminal devices to further increase the relative isolation of the AC signal from the DC bias network. Four and five terminal devices are implemented by further splitting the substrate actuation electrodes and/or capacitor plate electrodes.

The variable capacitor of the present invention may be susceptible to "stiction". Stiction is the term commonly used in the field of MEMS to describe the physical and/or chemical attractive forces that tend to hold two surfaces together in the absence of other secondary forces (i.e. electrostatic force, etc.). Stiction can cause the bimorph member to stick to the substrate electrode and capacitor plate after release of the sacrificial layer during fabrication or after release of the electrostatic force during operation. The in-operation effect may be minimal and manifest itself as hysteresis in performance or the effect may be much more dramatic and cause the bimorph element to remain permanently stuck to the substrate electrode and capacitor plate after the actuation force has been removed.

Figure 7:
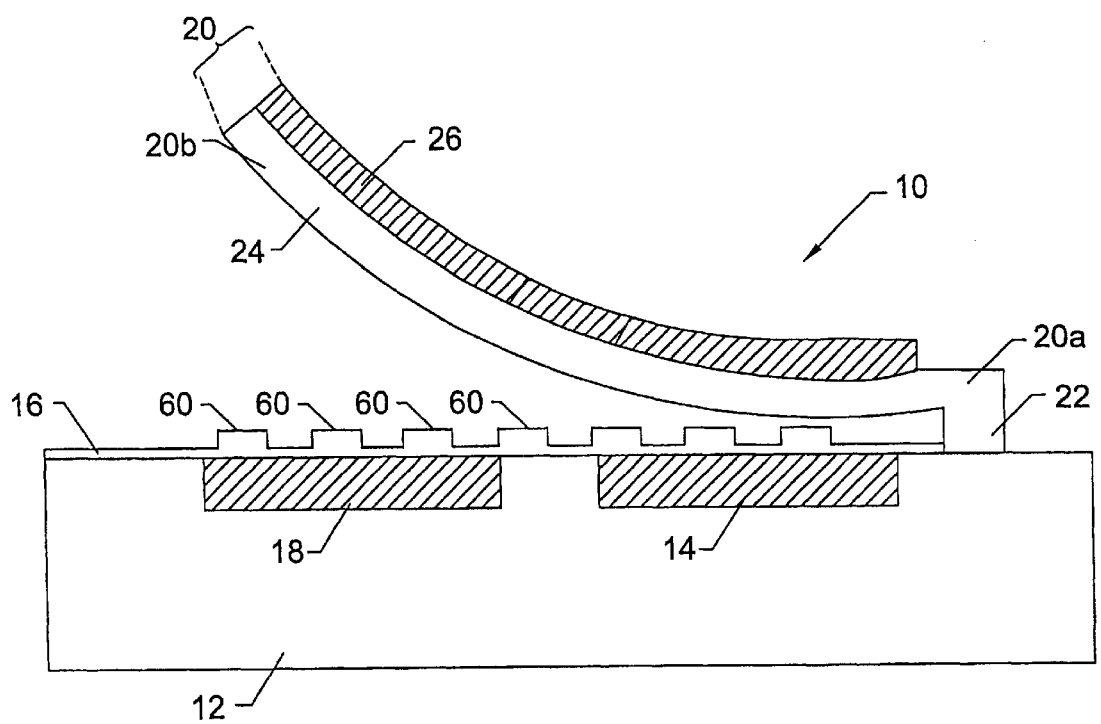
FIG. 7 is a cross-sectional view of a variable capacitor implementing an array of post-like structures to overcome stiction, in accordance with yet another embodiment of the present invention.
Figure 8:
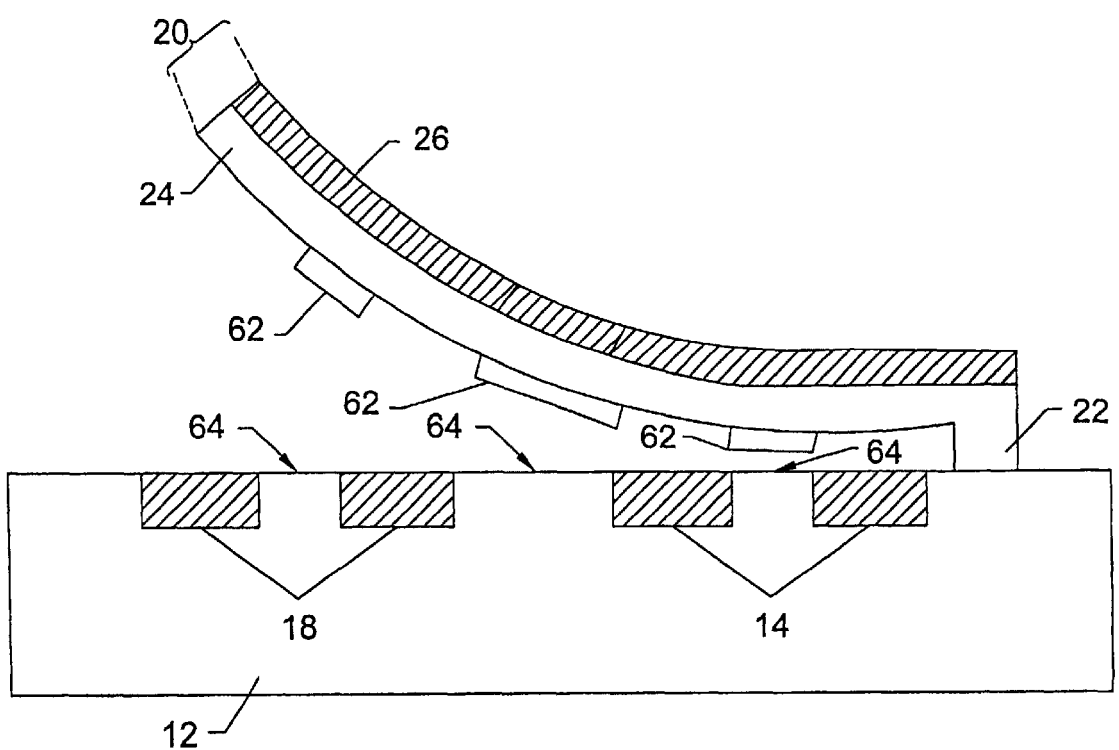
FIG. 8 is a cross-sectional view of a variable capacitor implementing an array of dimples and corresponding islands to overcome stiction, in accordance with another embodiment of the present invention.

FIGS. 7 and 8 illustrate cross-sectional views of two embodiments of the present invention that serve to alleviate the potential problems related to stiction. FIG. 7 is a cross-sectional view of a variable capacitor that implements a protective/dielectric layer 16 that forms an array of post-like structures 60. The protective/dielectric layer is disposed on the microelectronic substrate 12, the countersunk substrate electrode 14 and the countersunk substrate capacitor plate 18. The post-like structures are formed by subjecting a continuous protective/dielectric layer to a pattern and etch process. In embodiments in which the substrate electrode and/or the substrate capacitor plate comprise an HTS material, the post-like structures may be formed of a polymeric material or another similar material providing subsequent processing protection to the HTS and electrical isolation to the substrate electrode and capacitor plate. In embodiments in which the substrate electrode and the substrate capacitor plate are formed of non-HTS materials, such as a thick metal layer, the post-like structures may be formed of an oxide material, a nitride material or another suitable dielectric insulating material. The post-like structures are formed to subjecting the protective layer to a conventional pattern and etch process prior to disposing a sacrificial layer (not shown in FIG. 6) on the protective layer. The post-like structures serve to decrease the amount of surface area that the bimorph member contacts when the bimorph member is attracted to the substrate electrode. By providing for less contact area between the bimorph member and the substrate structures, it is possible to lessen the effects of stiction.

FIG. 8 is a cross-sectional view of a variable capacitor 10 that implements an array of dimples 62 on the bimorph member 20 and a corresponding array of islands 64 on the substrate 12 in accordance with an embodiment of the present invention. An array of dimples (small protrusions) are formed on the underside of the bimorph member nearest the microelectronic substrate (i.e. the exposed surface of the first layer 24). The dimples serve to provide texturing to the underside of the bimorph member. The dimples are typically formed during the same process step that provides for the first layer. Therefore, the dimples typically comprise a dielectric insulator, such as a nitride material, an oxide material or another material capable of providing electrical isolation. In fabrication, the dimples are typically formed by patterning and etching a secondary sacrificial layer (not shown in FIG. 8) that forms a mold of where dimples are to be made in the subsequently disposed first layer of the bimorph member. The islands are surfaces on the substrate that correspond to the dimples in the bimorph member. The islands serve as resting places for the dimples when the bimorph member is actuated toward the substrate. In the embodiment shown the islands exist within the countersunk electrode and capacitor plate and between the electrode and capacitor plate. By providing for a resting place, the dimple to island interface creates the necessary gap between the substrate electrode/substrate capacitor plate and the bimorph member to thereby prevent shorting.

Figure 9A:
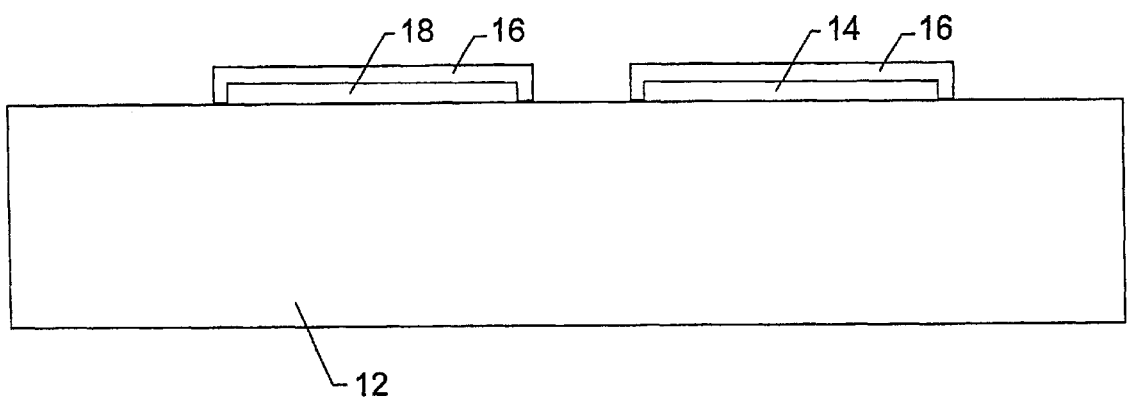
FIGS. 9a–9d are cross-sectional views illustrating the sequential operations performed during the fabrication of a HTS variable capacitor according to one embodiment to the present invention.
Figure 9B:
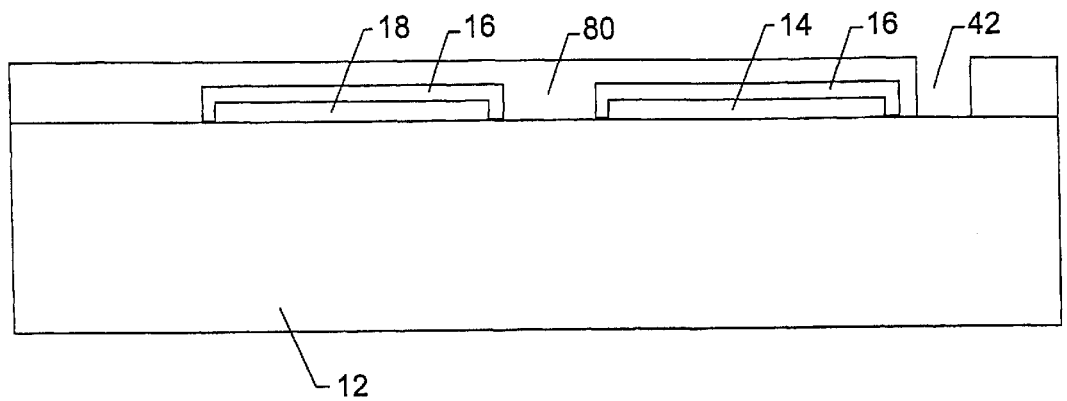
Figure 9C:
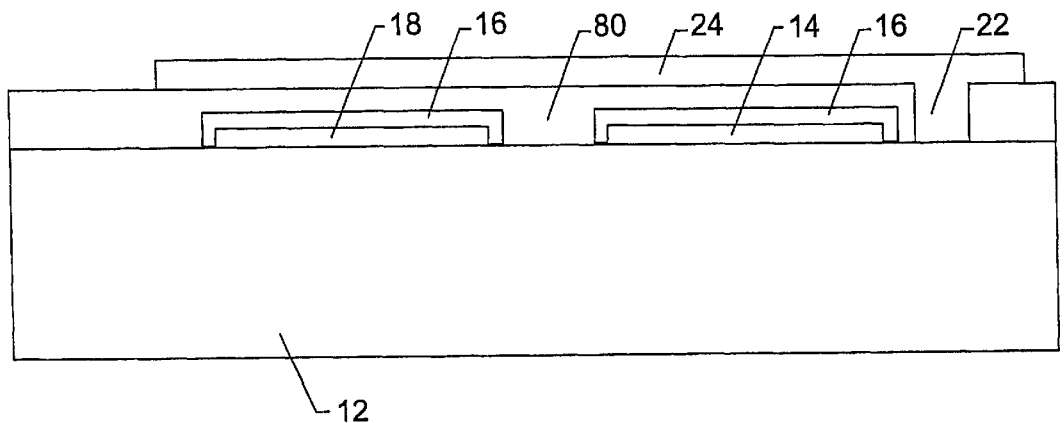

A method is also provided according to another aspect of the present invention for fabricating a variable capacitor 10, such as described above in conjunction with FIGS. 1–2. Various stages of the variable capacitor fabrication process are depicted in the cross-sectional views of FIGS. 9a–9d, in accordance with an embodiment of the present invention. This method details the processing involved in fabricating a variable capacitor having a substrate electrode and capacitor plate formed from an HTS material. In this regard, a layer of HTS material, such as YBCO or TBCCO, is initially deposited upon a substrate 12, such as a substrate formed of MgO, LaAlO$_3$ or NdCaAlO$_4$ or other substrate materials compatible with HTS materials. The HTS material is then patterned; such as by ion milling, to define at least one substrate electrode 14 and a substrate capacitor plate 18, spaced from the substrate electrode. Thereafter, the substrate electrode and the substrate capacitor plate are preferably coated with a dielectric layer 16, such as a protective film formed of polyimide, or a similar protective film capable of providing an insulating means to the variable capacitor. Although the dielectric layer can be deposited in different manners, typically, the dielectric layer is spun on and then reactive ion etched to produce the intermediate structure in which the substrate electrode and the substrate capacitor plate are each coated with a protective film as shown in FIG. 9a. Alternatively, a photoimagable protective film can be utilized such that the layer need not be reactive ion etched, but can be patterned by conventional photolithographic techniques.

According to the method of this aspect of the present invention, the intermediate structure is then coated with a sacrificial layer 80 of a low temperature oxide, such as silicon dioxide. Low temperature oxide is utilized to avoid exposing the HTS material that forms the substrate electrode 14 and the substrate capacitor plate 18 to high temperatures (>about 300 degrees Celsius) that could damage the HTS material. In this regard, the low temperature oxide is generally deposited, such as by Plasma Enhanced Chemical Vapor Deposition (PECVD), at a temperature of about 250° C. to about 300° C. The low temperature oxide is then patterned and etched to open a window 42 to the substrate 12 in which the anchor 22 of the bimorph member 20 will subsequently be formed. See, for example, FIG. 9b. The first layer 24 of the bimorph member is then formed upon the sacrificial layer. For example, a layer of gold, polymeric material or another suitable dielectric material, can be spun onto the sacrificial layer. The first layer may then be etched by means of reactive ion etching and annealed to form the structure shown in FIG. 9c.

Figure 9D:
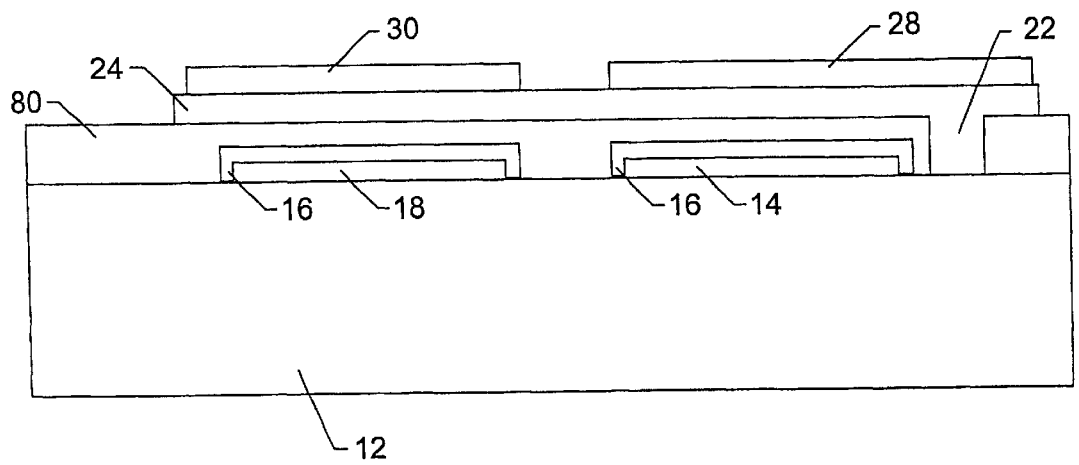

The second layer 26 of the bimorph member 20 can then be deposited on the first layer 24. Although the second layer, as shown, can be a continuous layer the second layer can alternatively be divided into regions that separately define the bimorph electrode and the bimorph capacitor plate. In this embodiment, the metallic material, such as aluminum, that forms the second layer of the bimorph member can be deposited, typically, using conventional deposition techniques and the intermediate structure depicted in FIG. 9d is produced. By thereafter etching the sacrificial layer 80, such as with hydrofluoric (HF) acid, the sacrificial layer is removed and the distal end 20b of the bimorph member is freed so as to curl away from the substrate 12 as shown in FIGS. 1 and 2.

Although not depicted in FIGS. 9a–9d, the fabrication method of the present invention can include the deposition of an adhesion layer upon the first layer 24 of the bimorph member 20 prior to depositing the second layer 26. Preferably, the adhesion layer is formed of a material such as chromium or titanium that is patterned to have the same shape and size as the second layer. For example, the variable capacitor 10 of the embodiment depicted in FIGS. 1 and 2 could have an adhesion layer deposited upon the first layer and the second layer can be deposited upon the adhesion layer in the manner described above. As a result of disposing an adhesion layer between the first and second layers of bimorph member, the second layer can be more robustly adhered to the first layer, particularly in instances in which the selection of materials for the first and second layers of the bimorph member would otherwise dictate that the second layer would not robustly adhere to the first layer. One such example in which an adhesion layer may be desirable is instances in which first layer of the bimorph member is formed of gold and the second layer of the bimorph member is formed of aluminum.

Figure 10A:
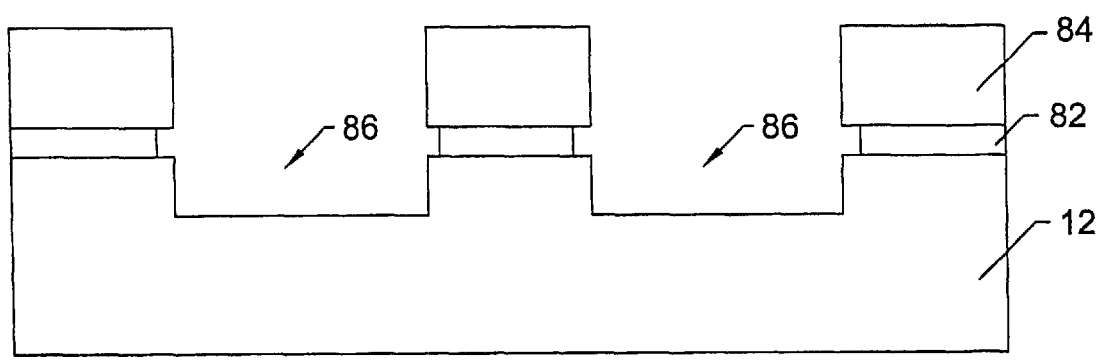
FIGS. 10a–10b are cross-sectional views illustrating the sequential operations performed during the fabrication of countersunk electrodes and capacitor plates in a non-HTS variable capacitor, in accordance with an embodiment of the present invention.
Figure 10B:
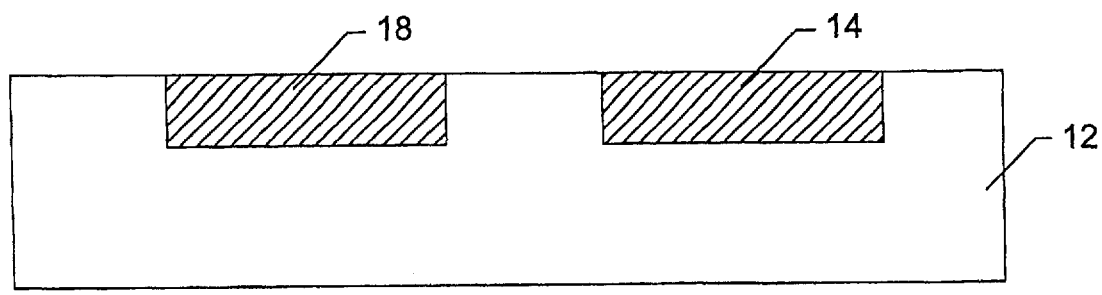

An alternative method for fabricating a variable capacitor having substrate electrode and substrate capacitor plate formed from non-HTS material is shown in the cross-sectional views of FIGS. 10a–10b illustrating various processing stages, in accordance with an embodiment of the present invention. In this regard, a thick layer of metal, such as gold is initially countersunk into the substrate. The substrate may comprise quartz, GaAs, or other suitable substrate materials. FIG. 10a illustrates the substrate 12 having a layer of poly-silicon material 82 and a layer of photoresist 84 disposed thereon. The photoresist material is exposed and developed to define those regions on the substrate where viaes will be fabricated. After development of the photo resist the poly-silicon layer and the substrate are etched away to define the viaes 86. In FIG. 10b, metal has been disposed in the viaes to form the countersunk substrate electrode 14 and the countersunk substrate capacitor plate 18 and the remaining photoresist and poly-silicon has been stripped away. An optional planarization process may be performed to planarize the substrate and the countersunk substrate electrode and capacitor plate. The remainder of the fabrication of the non-HTS variable capacitor is typically performed using the processing steps previously discussed starting with disposing a protective/dielectric layer on the countersunk elements and substrate.

In any event, the fabrication methods of this aspect of the present invention provides efficient and repeatable techniques for fabricating variable capacitors 10 utilizing micromachining techniques while including elements, such as electrodes and capacitor plates, formed of low electrical resistance materials. As such, the resulting variable capacitor will have relatively low loss and, consequently, a relatively high Q. The variable capacitors can therefore be used in applications that demand high Q, such as tunable filters for high frequency applications as described above.

According to further embodiments of the present invention, a first portion of a multilayer member that is remote from an anchor can curl away from a substrate. A second portion of the multilayer member is adjacent to the anchor and contacts the substrate. Having the second portion contact the substrate can reduce the spacing between the first portion and the substrate. Reducing the spacing can reduce a voltage level used to actuate the multilayer member relative to the substrate when used, for example, as part of a capacitor, relay, valve or other MEMS device that may move towards and/or away from the substrate.

Figure 11:
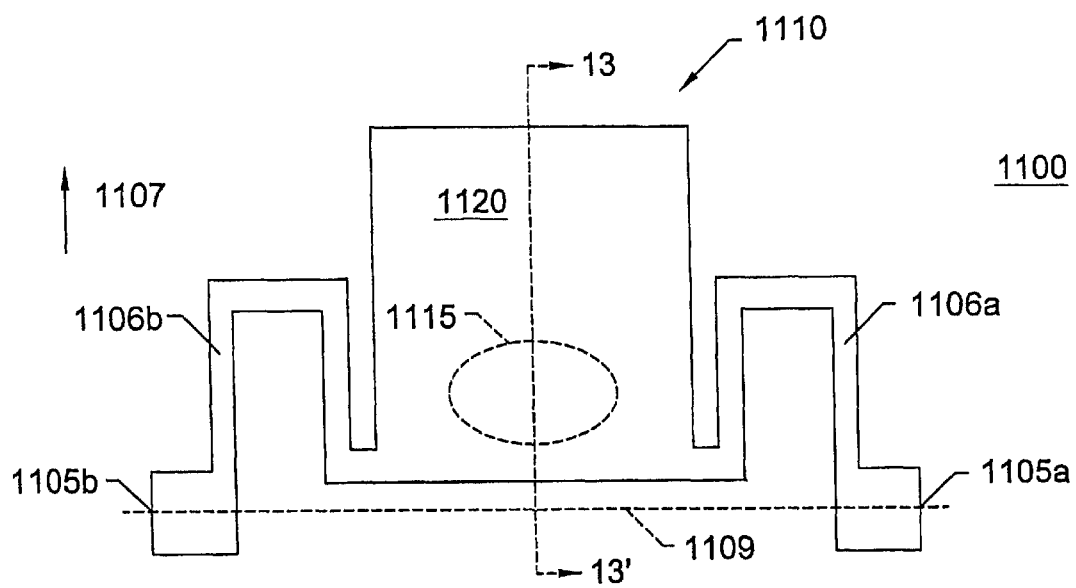
FIG. 11 is plan view that illustrates further embodiments of MEMS devices according to the present invention.

FIG. 11 is plan view that illustrates further embodiments of MEMS devices according to the present invention. In particular, first and second anchors 1105a–b can be attached to a substrate 1100 to define an anchor axis 1109 which passes through the two anchors. First and second connecting members 1106a–b can be spaced apart from the substrate 1100 and connected to the first and second anchors 1105a–b respectively and extend in a direction 1107. As shown in FIG. 11, the first and second connecting members 1106a–b can have a serpentine shape. Other shapes may be used. The first and second connecting members 1106a–b can be attached to a multilayer member 1110 that is spaced apart from the substrate 1100. The multilayer member 1110 can include first and second layers having different coefficients of thermal expansion. The first and second layers can be, for example, copper and aluminum. Additional layers can also be present.

The multilayer member 1110 can include a first portion 1120 that is remote from the first and second anchors 1105a–b. The first portion 1120 can curl away from the substrate 1100 as shown, for example, in FIG. 1 to assume a first position in response to a thermal effect or tensile stress between the first and second layers. The first portion 1120 may also curl towards the substrate 1100. The multilayer member 1110 can also include a second portion 1115 that is adjacent the anchors. The second portion 1115 can contact the substrate 1100 when the multilayer member 1110 is in the first position at a point that is between the anchor axis 1109 and the first portion 1120. It will be understood that although the second portion 1115 that contacts the substrate 1100 is shown as an approximately elliptically shaped portion of the multilayer member 1110, other shapes and contact positions are possible. For example, in some embodiments the second portion 1115 can include the entire width of the multilayer member 1110.

Figure 12:
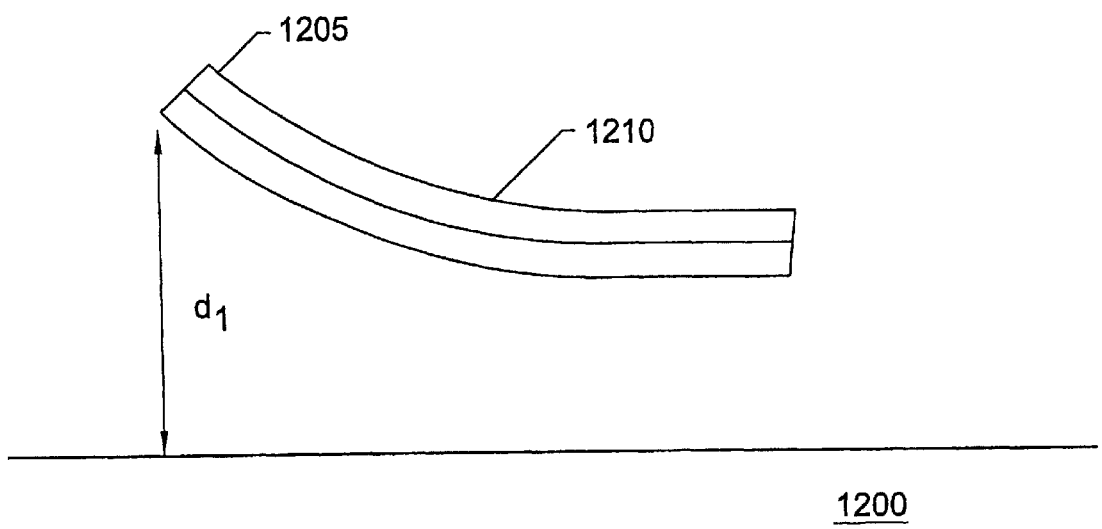
FIG. 12 is a cross-sectional view that illustrates multilayer members that curl away from a substrate.

It will be understood that the second portion 1115 can be any portion of the multilayer member 1110 that is located closer to the anchors than the first portion 1120. The multilayer member 1110 can be a bimorph member such as those described above, for example, in reference to FIGS. 1 and 12. In particular, FIG. 12 shows a cross-sectional view that illustrates a bimorph or multilayer member 1210 that is curled away from a substrate 1200 to provide a separation distance of d1 between the substrate 1200 and multilayer member 1210.

In operation, the separation between the multilayer member and the substrate can be reduced, for example, by heating or cooling the multilayer member or by providing for a difference in the tensile stresses associated with the layers of the multilayer member. A portion of the multilayer member may then come into contact with the substrate. Thereafter, a voltage level may be applied between the multilayer member and the substrate to further adjust the separation of the multilayer member and the substrate. For example, the voltage level may provide an electrostatic force that further reduces the separation or increases the separation.

Figure 13:
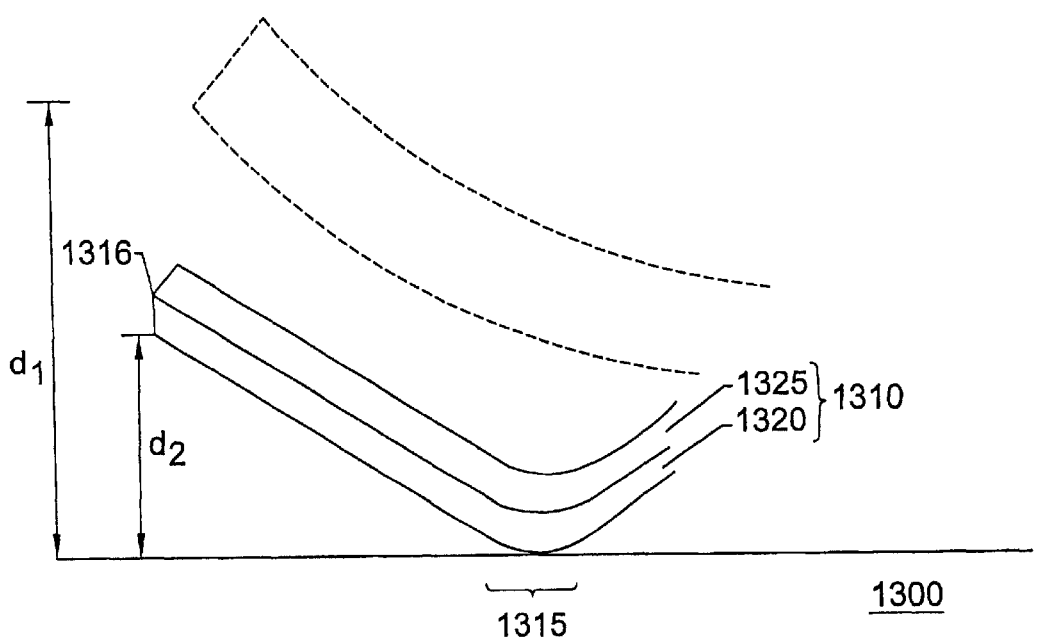
FIG. 13 is a cross-sectional view that illustrates embodiments of multilayer members in a first position taken along line 13–13' as shown in FIG. 11 according to the present invention.

FIG. 13 is a cross-sectional view that illustrates embodiments of multilayer members 1310 in a first position taken along line 13–13' as shown in FIG. 11 according to the present invention. As shown in FIG. 13, a first portion 1316 of the multilayer member 1310 can curl away from a substrate 1300 to a separation to distance of d2 that is less than d1. A second portion 1315 of the multilayer member 1310 can contact the substrate 1300 when the multilayer member 1310 is in the first position.

In some embodiments, the multilayer member 1310 includes a first layer 1320 adjacent the substrate that has a first coefficient of thermal expansion and a second layer 1325 on the first layer 1320 opposite the substrate 1300 having a second coefficient of thermal expansion. Heating the layers can cause one of the layers to expand more than the other depending on the coefficients of thermal expansion of each layer.

The first and second layers 1320, 1325 can also have different tensile stresses associated therewith. The multilayer member 1310 can move to the first position in response to a difference between the respective tensile stresses in the first and second layers 1320, 1325. The difference in the tensile stresses can cause the second portion 1315 to arch in the direction of the layer having the greater tensile stress. For example, according to FIG. 13, the arching of the multilayer member 1310 towards the substrate 1300 can be provided by a tensile stress of the first layer 1320 that is less than the tensile stress of the second layer 1325. Accordingly, the multilayer member 1310 may move to the first position after being released from the substrate 1300 during fabrication of the multilayer member 1310.

The multilayer member 1310 can also be moved in response to heating or cooling the first and second layers 1320, 1325. For example, if the first coefficient of thermal expansion is greater than the second coefficient of thermal expansion, the contact of the second portion 1315 with the substrate 1300 can be provided by heating the first and second layers 1320, 1325. If, on the other hand, the first coefficient of thermal expansion is less than the second coefficient of thermal expansion, the contact of the second portion 1315 with the substrate 1300 can be provided by cooling the first and second layers 1320, 1325.

The movement of the second portion 1315 may also be reversed by heating or cooling the layers depending on the relative coefficients of thermal expansion associated with the respective layers. For example, according to FIG. 13, if the first coefficient of thermal expansion is greater than the second coefficient of thermal expansion, contact with the substrate 1300 can be removed by cooling.

Referring still to FIG. 13, after the second portion 1315 contacts the substrate 1300 the movement of the first portion 1316, that is for example at the end of the multilayer member 1310, towards the substrate 1300 may be more controllable. For example, the separation between the first portion 1316 and the substrate 1300 may be controlled over the entire distance that separates the first portion 1316 and the substrate 1300.

In contrast to the present invention, in some conventional arrangements where no portion of the member contacts the substrate, the movement of the end of the member towards the substrate may only be controllable for a first part of the travel towards the substrate, but may be unstable as the end approaches the substrate. In particular, the end may reach a point where the end becomes unstable and "snaps" to the substrate. Movement between the unstable point and the substrate may, therefore, be difficult to control.

Moreover, when the multilayer member 1310 moves to the first position, the first portion 1316 can move towards the substrate 1300 so that the distance that separates the first portion 1316 from the substrate 1300 can be reduced from d1 to d2. The first portion 1316 may also curl away from the substrate 1300 as described above in reference to FIGS. 1 and 12. Reducing the spacing can reduce a voltage level used to actuate the multilayer member relative to the substrate when used, for example, as part of a capacitor, relay, valve or other MEMS device that may move towards and/or away from the substrate.

Figure 14:
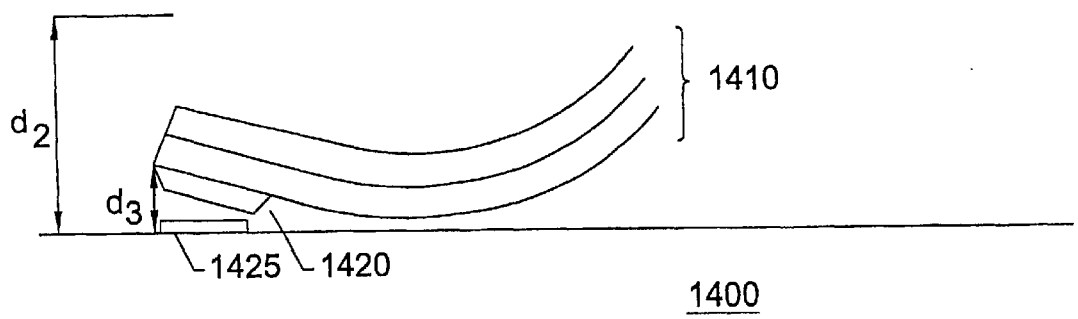
FIG. 14 is a cross-sectional view that illustrates embodiments of multilayer members in a second position taken along line 13–13' as shown in FIG. 11 according to the present invention.

FIG. 14 is a cross-sectional view that illustrates embodiments of multilayer members 1410 in a second position taken along line 13–13' as shown in FIG. 11 according to the present invention. As shown in FIG. 14, a first electrode 1420 can be located on the multilayer member 1410 and a second electrode 1425 can be located on a substrate 1400 opposite the first electrode 1420. A voltage level can be applied across the first and second electrodes 1420, 1425 to develop an electrostatic force that can cause the separation between the multilayer member 1410 and the substrate 1400 to be further reduced to a distance d3. It will be understood that the voltage level can also be used to increase the separation between the multilayer member 1410 and the substrate 1400.

Accordingly, the voltage level used to provide the separation d3 may be reduced compared to conventional devices. For example, in some conventional devices, a member may be separated from the substrate by a distance which is greater than the distance d3, as shown in FIGS. 1 and 12. The voltage level used to provide the needed electrostatic force in such conventional systems may exceed those used in embodiments according to the present invention.

Figure 15:
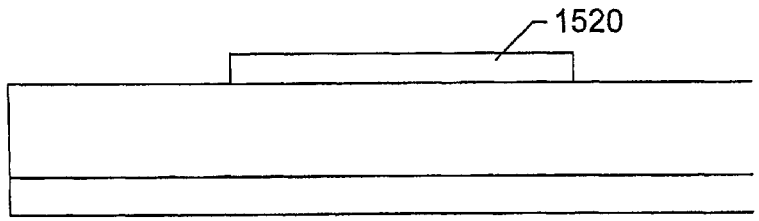
FIGS. 15 and 16 are cross-sectional views that illustrate embodiments of multilayer members including thermal effect devices according to the present invention.
Figure 16:
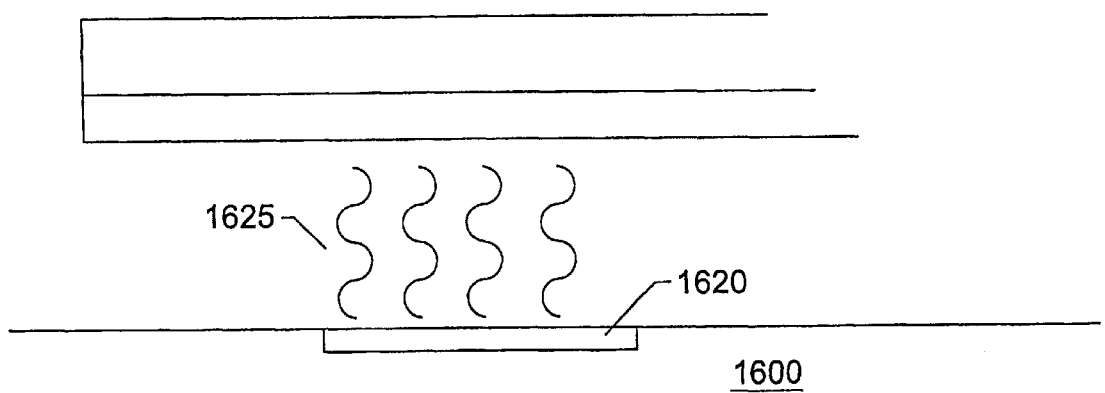

As shown in FIGS. 15 and 16, the heating and/or cooling of the first and second layers of the multilayer member can be provided by a thermal effect device. According to FIG. 15, in some embodiments according to the present invention, the thermal effect device 1520 can be located on one of the layers of the multilayer member. In other embodiments according to the present invention, a thermal effect device 1620 can be located on a substrate 1600 that heats and/or cools the layers of the multilayer member across a gap 1625 that separates the multilayer member from the substrate 1600. In some embodiments, the thermal effect device is a heater. In other embodiments, the heating can be provided by passing a current through the multilayer member. Heating of MEMS devices are discussed further, for example, in U.S. patent application Ser. No. 09/537,588, filed on Mar. 28, 2000, entitled Microelectromechanical Systems including Thermally Actuated Beams on Heaters That Move With The Thermally Actuated Beans Filed, which is commonly assigned to the assignee of the present application, the entire disclosure of which is hereby incorporated herein by reference. In other embodiments, the thermal effect device can be a thermo-electric device such as a Peltier device. Peltier devices are discussed further, for example, in U.S. Pat. No. 5,079,618, to Farnsworth et al., entitled Semiconductor Device Structure Cooled By Peltier Junctions And Electrical Interconnect Assemblies, the entire disclosure of which is hereby incorporated herein by reference.

Figure 17:
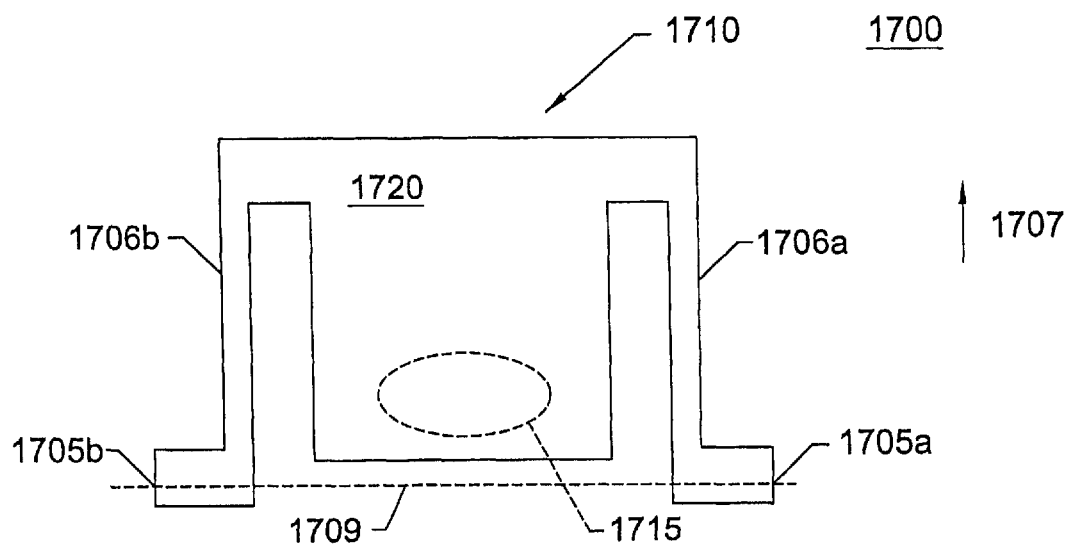
FIGS. 17, 18 and 19 are plan views that illustrate further embodiments of MEMS devices having different connecting member configurations according to the present invention.
Figure 18:
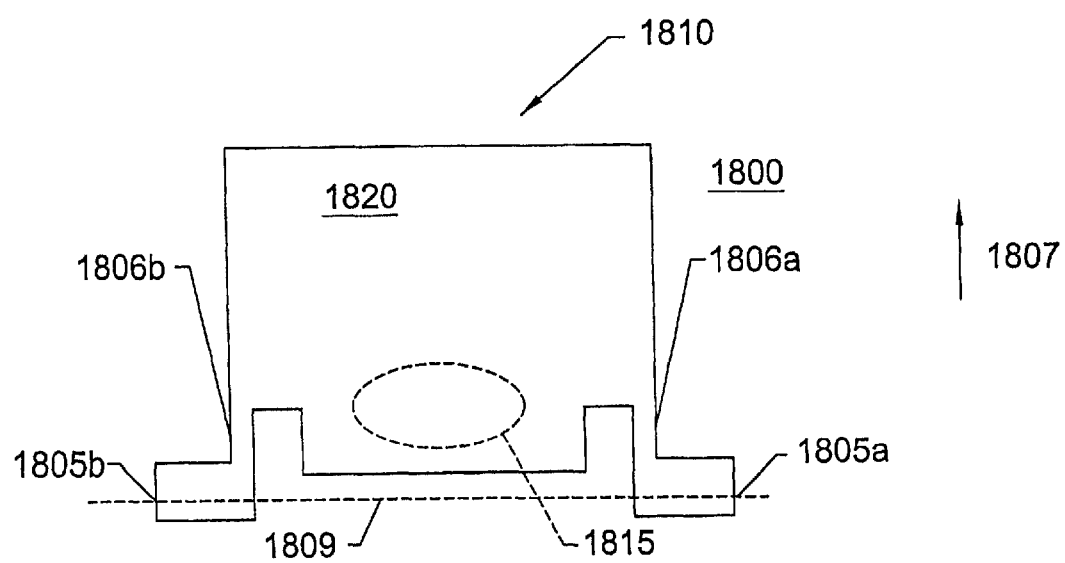
Figure 19:
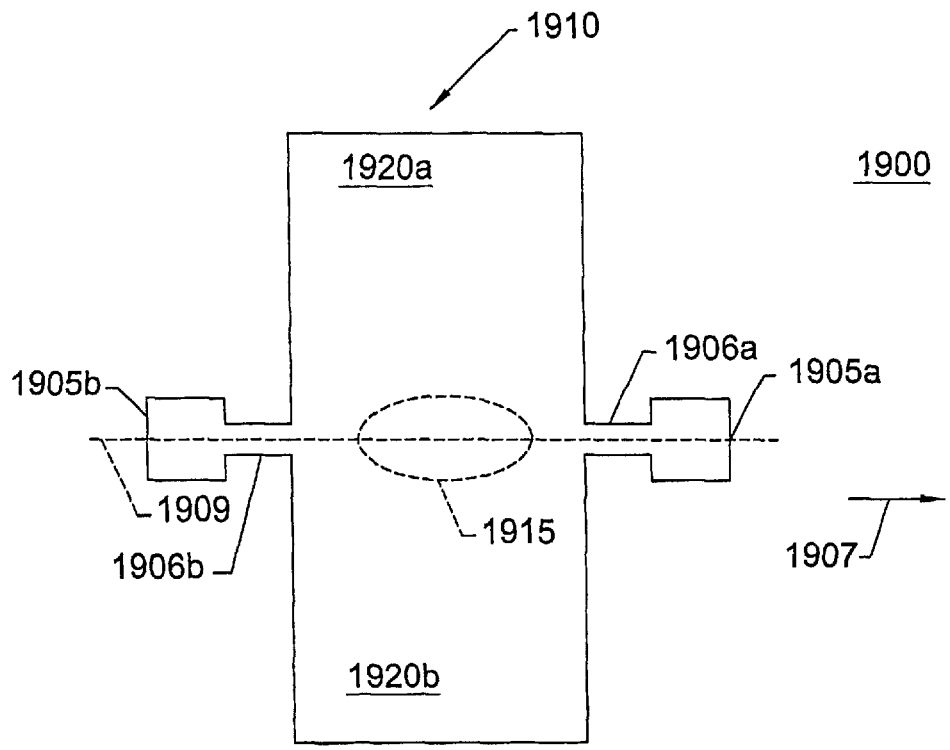

FIGS. 17 through 19 are plan views that illustrate further embodiments of MEMS devices having different connecting member configurations according to the present invention. In particular, FIGS. 17 through 19 illustrate embodiments according to the present invention where the attachment of the anchors to the multilayer members via the respective connecting members allow portions of the multilayer members to contact the respective substrate. It will be understood that other anchor configurations may be used to allow portions of the multilayer members to contact the substrates.

As shown in FIG. 17, first and second anchors 1705a–b can be attached to a substrate 1700 to define an anchor axis 1709 which passes through the two anchors. First and second connecting members 1706a–b can be spaced apart from the substrate 1700 and connected to the first and second anchors 1705a–b respectively and extend in a direction 1707. The first and second connecting members 1706a–b can be attached to a multilayer member 1710 that is spaced apart from the substrate 1700. The multilayer member 1710 can include a first portion 1720 that is remote from the anchors and a second portion 1715 that is adjacent the anchors. The multilayer member 1710 can include first and second layers having different coefficients of thermal expansion. The first and second layers can be, for example, copper and aluminum. More layers may be present. It will be understood that the connecting members may have multiple layers and may be formed as part of the multilayer member 1710 so that they form one unit.

The connecting members 1706a–b can be attached to a portion of the multilayer member 1710 that is closer to the first portion 1720 than the second portion 1715. For example, as shown in FIG. 17, the connecting members 1706a–b can be attached to the far ends of the multilayer member 1710 relative to the first and second anchors.

The first portion 1720 can curl away from the substrate 1700 as shown, for example in FIGS. 1 and 12, to assume a first position in response to a thermal effect or tensile stress between the first and second layers. The second portion 1715 can also move towards the substrate 1700 and can contact the substrate 1700 at a point between the anchor axis 1709 and the first portion 1720 when the multilayer member 1700 is in the first position.

As shown in FIG. 18, first and second anchors 1805a–b can be attached to a substrate 1800 to define an anchor axis 1809 which passes through the two anchors. First and second connecting members 1806a–b can be spaced apart from the substrate 1800 and connected to the first and second anchors 1805a–b respectively and extend in a direction 1807. The first and second connecting members 1806a–b can be attached to a multilayer member 1810 that is spaced apart from the substrate 1800. The multilayer member 1810 can include a first portion 1820 that is remote from the anchors and a second portion 1815 that is adjacent the anchors by a second distance. The multilayer member 1810 can include first and second layers having different coefficients of thermal expansion. The first and second layers can be, for example, copper and aluminum. More layers can be present.

The first and second connecting members 1806a–b may be attached to the a portion of the multilayer member 1810 that is closer to the second portion 1815 than the first portion 1820. For example, as shown in FIG. 18, the connecting members 1806a–b can be attached to the ends of the multilayer member 1810 that are close to the second portion 1815.

The first portion 1820 can curl away from the substrate 1800 when the multilayer member 1810 moves, as shown for example in FIGS. 1 and 12, to a first position in response to a thermal effect or tensile stress between the first and second layers. The second portion 1815 can also move towards the substrate 1800 and can contact the substrate 1800 at a point between the anchor axis 1809 and the first portion 1820 when the multilayer member 1800 is in the first position.

As shown in FIG. 19, first and second anchors 1905a–b can be attached to a substrate 1900 to define an anchor axis 1909 which passes through the two anchors. First and second connecting members 1906a–b can be spaced apart from the substrate 1900 and connected to the first and second anchors 1905a–b respectively and extend in a direction 1907. The first and second connecting members 1906a–b can be attached to a multilayer member 1910 that is spaced apart from the substrate 1900. The multilayer member 1910 can include first portions 1920a–b that are remote from the anchors and a second portion 1915 that is adjacent the anchors. The multilayer member 1910 can include first and second layers having different coefficients of thermal expansion. The first and second layers can be, for example, copper and aluminum. More layers can be present.

The first and second connecting members 1906a–b may be attached to the a portion of the multilayer member 1910 that is closer to the second portion 1915 than the first portions 1920a–b. For example, as shown in FIG. 19, the connecting members 1906a–b can be attached to the multilayer member 1910 at points that are closer to the second portion 1915 than the first portions 1920a–b.

The first portions 1920a–b can curl away from the substrate 1900 when the multilayer member 1910 moves, as shown for example in FIGS. 1 and 12, to a first position in response to a thermal effect or tensile stress between the first and second layers. The second portion 1915 can also move towards the substrate 1900 and can contact the substrate 1900 inline with the anchor axis 1909 when the multilayer member 1900 is in the first position.

Figure 20:
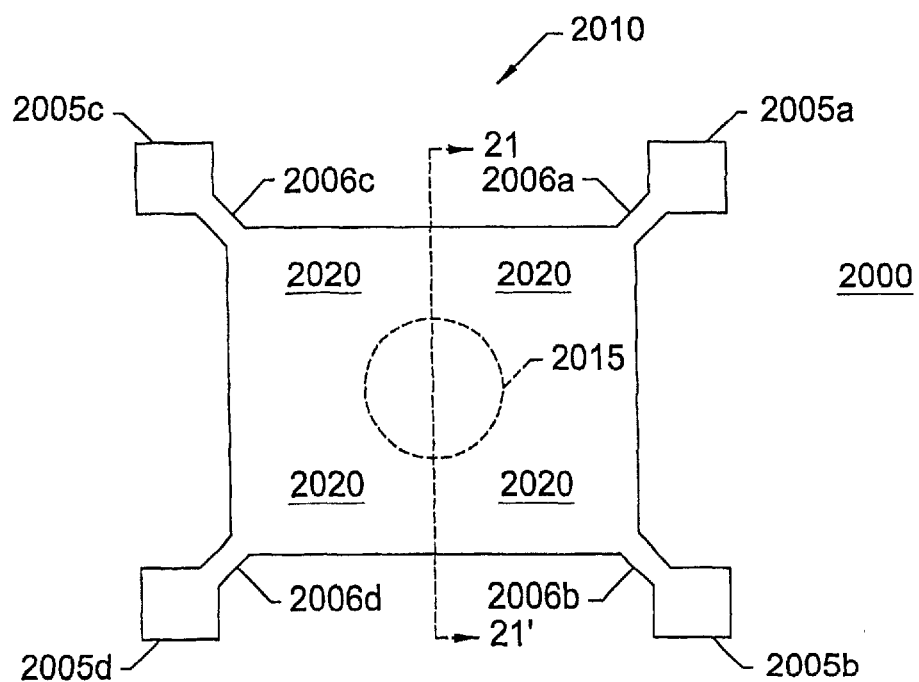
FIG. 20 is a plan view that illustrates further embodiments of MEMS devices according to the present invention.

FIG. 20 is a plan view that illustrates further embodiments according to the present invention. In particular, four anchors 2005a–d can be attached to a substrate 2000. Four connecting members 2006a–d can be spaced apart from the substrate 2000 and connected to the four anchors 2005a–d respectively. The connecting members 2006a–d can be attached to a multilayer member 2010 that is spaced apart from the substrate 2000.

The multilayer member 2010 can include first portions 2020 that are, for example, located at opposite edges of the multilayer member 2010. Each of the first portions 2020 can be remote from an opposite anchor 2005. The multilayer member 2010 can also include a second portion 2015 that is adjacent to the anchors 2005. The second portion 2015 can be located in a central area of the multilayer member 2010. It will be understood that the second portion 2015 can be located in other areas of multilayer member 2010. The multilayer member 2010 can include first and second layers having different coefficients of thermal expansion. The first and second layers can be, for example, copper and aluminum. More layers can be present.

Figure 21A:
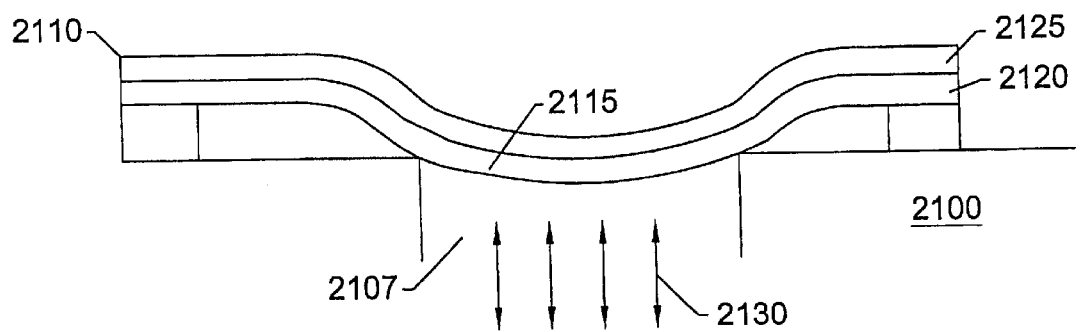
FIGS. 21A and 21B are cross-sectional views that illustrate embodiments of multilayer members that can operate as valves according to the present invention.

The second portion 2015 can move towards and can contact the substrate 2000, as shown for example in FIG. 21A, when the multilayer member 2010 moves to a first position in response to a thermal effect or tensile stress between first and second layers 2120, 2125. Although the multilayer member 2010 is shown in FIG. 20 as being attached to four anchors, it will be understood that fewer anchors may be used. For example, the multilayer member 2010 can be attached to one or two anchors so that the first portion can curl away from the substrate.

As shown in FIG. 21A, in some embodiments according to the present invention, a via 2107 can be formed in a substrate 2100 under a portion 2115 of a multilayer member 2110. When the multilayer member 2110 moves to a first position, the portion 2115 can contact the substrate 2100 and obstruct the via 2107.

In the first position, the multilayer member 2110 can be in contact with the via 2107 to reduce a flow 2130 to and/or from the via 2107. The first position can be provided, for example, by a difference in the tensile stresses associated with the layers of the multilayer member 2110. For example, if a tensile stress of a first layer 2120 is less than a tensile stress of a second layer 2125, the multilayer member 2120 may move to the first position after the multilayer member 2110 is released from the substrate 2100 during formation of the MEMS device.

Figure 21B:
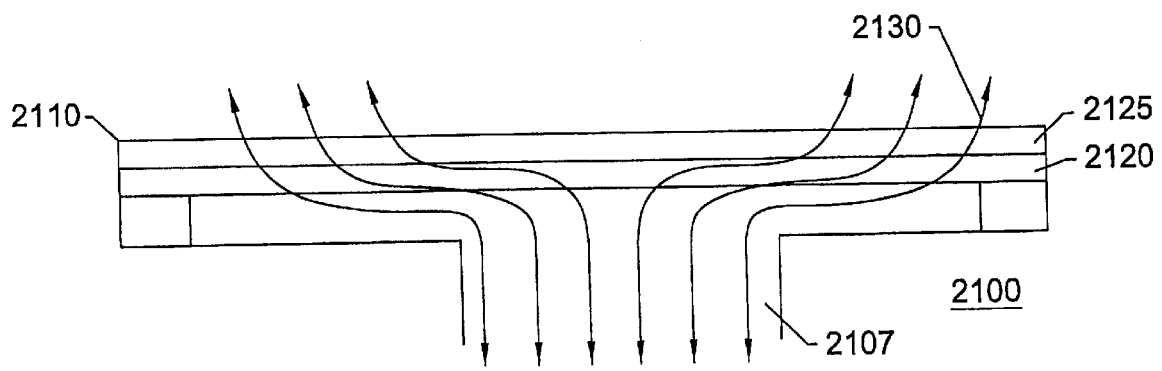

In a second position, the portion 2115 of the multilayer member 2110 may be separated from the via 2107 to increase the flow 2130 to and/or from the via 2107, as shown for example in FIG. 21B. The second position may be provided by heating or cooling the multilayer member 2110, depending on the coefficients of thermal expansion associated with the first and second layers 2120, 2125. The multilayer member 2110 can be returned to the first position by, for example, reversing the thermal effect used to move the multilayer member to the second position. Embodiments according to the present invention illustrated by FIGS. 21A and 21B may be used to provide, for example, valves, capacitors, relays and the like.

Figure 22A:
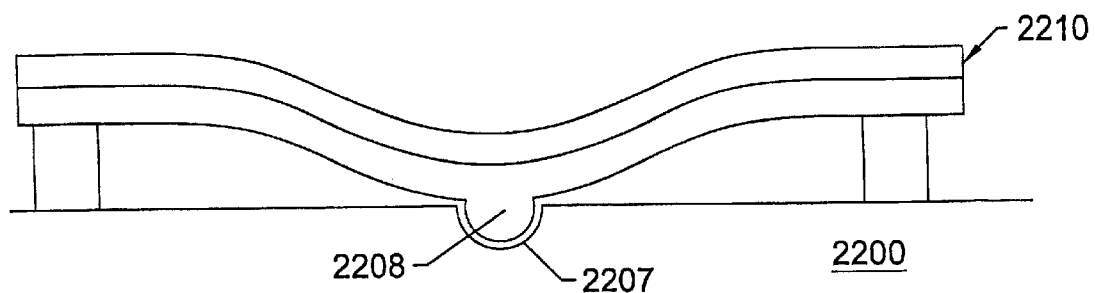
FIGS. 22A and 22B are cross-sectional views that illustrate further embodiments of multilayer members according to the present invention.
Figure 22B:
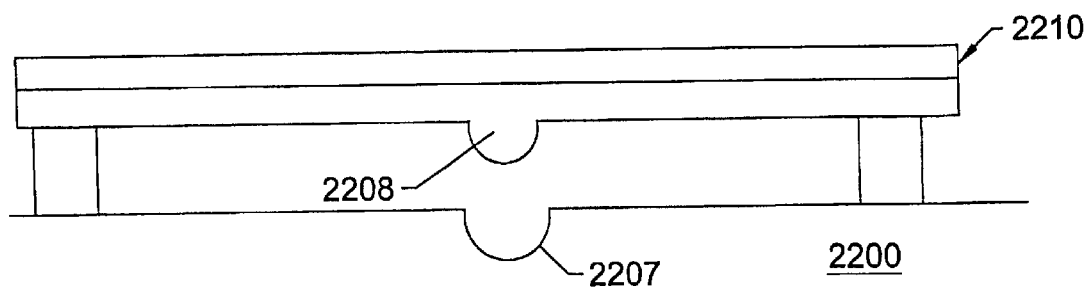

In other embodiments according to the present invention, a protrusion 2208 from a multilayer member 2210 can be coupled to a receptacle 2207 when the multilayer member 2210 is in the first position as shown, for example, in FIG. 22A. When the multilayer member 2210 is moved to second position, the protrusion 2208 can be decoupled from the receptacle 2207 as shown, for example, in FIG. 22B. Embodiments according to the present invention can, therefore, provide MEMS devices which are normally in a 'closed' position after being released from the substrate during fabrication as shown in FIGS. 21A–B and 22A–B.

As used herein, when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will be understood that when part of an element is referred to as "outer," it is closer to the outside of the integrated circuit than other parts of the element.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed:

1. A microelectromechanical system (MEMS) device comprising:
    a substrate;
    an anchor attached to the substrate; and
    a multilayer member attached to the anchor and spaced apart from the substrate, the multilayer member having a first portion that is remote from the anchor and that curls away from the substrate and a second portion that is adjacent to the anchor and that contacts the substrate.

2. A MEMS device according to claim 1, wherein the multilayer member extends in a direction, the MEMS device further comprising:
    a connecting member having a portion that extends in the direction and that attaches the anchor to the multilayer member.

3. A MEMS device according to claim 2, wherein the connecting member comprises a serpentine shaped connecting member.

4. A MEMS device according to claim 2, wherein the connecting member is attached to a third portion of the multilayer member that is closer to the first portion than the second portion.

5. A MEMS device according to claim 2, wherein the connecting member is attached to a third portion of the multilayer member that is closer to the second portion than the first portion.

6. A MEMS device according to claim 1, wherein the anchor comprises a first anchor, the MEMS device further comprising:
    a second anchor attached to the substrate and the multilayer member that defines an anchor axis that passes through the first and second anchors, wherein the second portion contacts the substrate at a point between the anchor axis and the first portion.

7. A MEMS device according to claim 1, wherein the anchor comprises a first anchor, the MEMS device further comprising:
    a second anchor attached to the substrate and the multilayer member that defines an anchor axis that passes through the first and second anchors, wherein the second portion contacts the substrate inline with the anchor axis.

8. A MEMS device according to claim 1, wherein the multilayer member comprises:
    a first layer adjacent to the substrate having a first coefficient of thermal expansion; and
    a second layer on the first layer opposite the substrate having a second coefficient of thermal expansion that is less than the first coefficient of thermal expansion, wherein the multilayer member contacts the substrate in response to heating the first and second layers.

9. A MEMS device according to claim 8 further comprising:
   a heater that heats the first and second layers of the multilayer member.

10. A MEMS device according to claim 1, wherein the multilayer member comprises:
   a first layer adjacent to the substrate having a first coefficient of thermal expansion; and
   a second layer on the first layer opposite the substrate having a second coefficient of thermal expansion that is greater than the first coefficient of thermal expansion, wherein the multilayer member contacts the substrate in response to cooling at least one of the first and second layers.

11. A MEMS device according to claim 9 further comprising:
   a thermo-electric cooling device that cools the first and second layers of the multilayer member.

12. A MEMS device according to claim 1, wherein the multilayer member comprises:
   a first layer adjacent to the substrate having a first tensile stress; and
   a second layer on the first layer opposite the substrate having a second tensile stress that is greater than the first tensile stress, wherein the multilayer member contacts the substrate in response to a difference between the first tensile stress and the second tensile stress.

13. A MEMS device according to claim 1 further comprising:
   a first plate on the substrate; and
   a second plate on the multilayer member, wherein the first portion moves relative to the substrate in response to a voltage applied between the first and second plates.

14. A MEMS device according to claim 1 further comprising:
   an insulator on the substrate where the second portion contacts the substrate.

15. A MEMS device according to claim 1, wherein the first portion is separated from the substrate by a first distance when the multilayer member is in a first position; and
   wherein the first portion is separated from the substrate by a second distance that is less than the first distance when the multilayer member is in a second position.

16. A MEMS device according to claim 1 further comprising:
   a second anchor attached to the substrate and the first portion of the multilayer member at a point that is closer to the first portion than the second portion.

17. A MEMS device according to claim 16 further comprising:
   a via opposite the second portion of the multilayer member, wherein the second portion of the multilayer member contacts the via when in the first position.

18. A MEMS device according to claim 16 further comprising:
   a receptacle on the substrate opposite the second portion of the multilayer member; and
   a protrusion from the second portion, wherein the protrusion is coupled to the receptacle when the multilayer member is in the first position.

19. A MEMS device according to claim 18, wherein the protrusion is separated from the receptacle when the multilayer member is in the second position.

20. A MEMS device according to claim 19, wherein the second portion moves away from the substrate in response to a thermal effect.

21. A method of actuating a microelectromechanical system (MEMS) device comprising:
   changing the temperature associated with the multilayer member to reduce a distance between the multilayer member and the substrate;
   allowing a portion of the multilayer member to contact the substrate; and then applying a voltage between the multilayer member and the substrate to adjust the distance therebetween.

22. A method according to claim 21, wherein the act of changing comprises one of heating and cooling the multilayer member.

23. A method according to claim 21, wherein the act of applying is followed by:
   changing a temperature associated with the multilayer member to increase the distance between the multilayer member and the substrate.

24. A microelectromechanical system (MEMS) device comprising:
   a substrate;
   an anchor attached to the substrate; and
   a multilayer member attached to the anchor and spaced apart from the substrate, the multilayer member is configured so as to contact the substrate at an intermediate point thereof.

25. A MEMS device according to claim 24, wherein the multilayer member extends in a direction, the MEMS device further comprising:
   a connecting member having a portion that extends in the direction and that attaches the anchor to the multilayer member.

26. A MEMS device according to claim 25, wherein the connecting member comprises a serpentine shaped connecting member.

27. A MEMS device according to claim 25, wherein the connecting member is attached to a portion of the multilayer member remote from the anchor and that is adjacent to the intermediate point that contacts substrate.

28. A method of positioning a multilayer member on a substrate that is attached thereto via an anchor, the method comprising:
   curling a first portion of the multilayer member that is remote from the anchor away from the substrate to a first position that is spaced-apart from the substrate by a first distance and moving a second portion of the multilayer member that is adjacent to the anchor to contact the substrate; and then
   moving the first portion to a second position that is spaced apart from the substrate by a second distance that is less than the first distance.

29. A method according to claim 28, wherein the first portion is moved to the first position via a tensile force between at least two layers of the multilayer member.

30. A method according to claim 28, wherein the first portion is moved to the second position via a thermal effect between at least two layers of the multilayer member.

31. A method according to claim 28 further comprising:
   maintaining the second distance without contacting the substrate.

* * * * *